United States Patent
Ohbayashi

(10) Patent No.: US 6,452,269 B1
(45) Date of Patent: Sep. 17, 2002

(54) SEMICONDUCTOR INTEGRATED CIRCUIT HAVING POWER SUPPLY PIN

(75) Inventor: Shigeki Ohbayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/570,440

(22) Filed: May 12, 2000

(30) Foreign Application Priority Data

Nov. 18, 1999 (JP) .............................. 11-328314

(51) Int. Cl.⁷ .............................................. H01L 23/48
(52) U.S. Cl. ...................... 257/734; 257/909; 257/905; 257/666; 257/691; 257/697
(58) Field of Search ................................. 257/905, 691, 257/697, 666, 734, 696, 695, 909

(56) References Cited

U.S. PATENT DOCUMENTS 5,998,869 A * 12/1999 Lin et al. ..................... 257/734

FOREIGN PATENT DOCUMENTS

| JP | 1-258461 | 10/1989 |
| JP | 8-435 | 2/1996 |
| JP | 10-294429 | 11/1998 |

OTHER PUBLICATIONS

"256Kx36 & 512Kx18–Bit Synchronous Pipelined Burst SRAM", Samsung Electronics, Rev. 3.0, May 1999, pp. 1–17.

"256Kx36–Bit Pipelined MtRAM™", Samsung Electronics, Rev. 3.0, May 1999, pp. 1–18.

"2M–Bit CMOS Synchronous Fast SRAM 64K–Word by 36–Bit Pipelined Operation", NEC Corporation, 1998, pp. 1–24. (No month).

* cited by examiner

*Primary Examiner*—David L. Talbott
*Assistant Examiner*—Luan Thai
(74) *Attorney, Agent, or Firm*—McDermott, Will & Emery

(57) ABSTRACT

A semiconductor integrated circuit according to the present invention comprises a memory array, an input circuit for writing data in the memory array and reading data from the memory array, an output circuit and a package, including 100 pins, storing the memory array, the input circuit and the output circuit. A fourth pin, an eleventh pin, a twentieth pin, a twenty-seventh pin, a fifty-fourth pin, a sixty-first pin, a seventieth pin and a seventy-seventh pin are supplied with the same voltage. The input circuit and the output circuit receive a power supply voltage from different ones of these pins. Thus, a semiconductor integrated circuit resistant against noise and capable of responding to a high operating frequency is provided.

9 Claims, 21 Drawing Sheets

SEMICONDUCTOR INTEGRATED CIRCUIT HAVING POWER SUPPLY PIN

BACKGROUND OF THE INVENTION

1. Field of the Invention

The present invention relates to a semiconductor integrated circuit, and more specifically, it relates to a synchronous SRAM supplied with two types of power supply voltages.

2. Description of the Background Art

A synchronous SRAM (static random access memory) mainly comprises two power sources for power supplied to an internal circuit and power for an input/output circuit deciding an input/output level. This is because a voltage optimum for the synchronous SRAM to keep a high speed itself and a voltage optimum for a logic chip of a CPU (central processing unit) or a chip set directly connected with the synchronous SRAM are different from each other.

More specifically, power Vdd for the internal circuit of the synchronous SRAM is generally 3.3 V (or 2.5 V as the case may be), and power VddQ for the input/output circuit is 2.5 V or 1.8 V. The power VddQ is equalized with a power supply voltage supplied to a peripheral logic chip of the synchronous SRAM. When the power VddQ is set to 2.5 V or 1.8 V, the synchronous SRAM the input/output level of the synchronous SRAM reaches a CMOS (complementary metal-oxide semiconductor) level of 2.5 V or 1.8 V (a high level is 2.5 V or 1.8 V, and a low level is 0 V).

As typical examples of such a synchronous SRAM, FIGS. 12 and 13 show a type 1 pipelined burst SRAM and FIGS. 14 and 15 show a synchronous network SRAM respectively. The synchronous network SRAM is an advanced standard synchronous SRAM in the process of standardization in JEDEC (Joint Electron Device Engineering Council). In the following description, pins and signals corresponding to the pins are denoted by the same reference numerals.

FIG. 12 illustrates the pin arrangement of the type 1 pipelined burst SRAM. Referring to FIG. 12, fifteenth, forty-first, sixty-fifth and ninety-first pins are power supply pins Vdd for an internal circuit, seventeenth, fortieth, sixty-seventh and ninetieth pins are ground power supply pins Vss for the internal circuit, fourth, eleventh, twentieth, twenty-seventh, fifty fourth, sixty-first, seventieth and seventy-seventh pins are power supply pins VddQ for an output buffer, and fifth, tenth, twenty-first, twenty-sixth, fifty-fifth, sixtieth, seventy-first and seventy-sixth pins are ground power supply pins VssQ for the output buffer.

Fifty-second, fifty-third, fifty-sixth to fifty ninth, sixty-second and sixty-third pins are data input/output pins DQa, sixty-eighth, sixty-ninth, seventy-second to seventy-fifth, seventy-eighth and seventy-ninth pins are data input/output pins DQb, second, third, sixth to ninth, twelfth and thirteenth pins are data input/output pins DQc, and eighteenth, nineteenth, twenty-second to twenty-fifth, twenty-eighth and twenty-ninth pins are data input/output pins DQd. Fifty-first, eightieth, first and thirtieth pins are parity data input/output pins DQPa, DQPb, DQPc and DQPd.

Thirty-second to thirty-fifth, forty-fourth to fiftieth, eighty-first, eighty-second, ninety-ninth and hundredth pins are address input pins A, and thirty-seventh and thirty-sixth pins are address input pins A0 and A1. An eighty-ninth pin is a clock input pin CLK. Ninety-second, ninety seventh and ninety-eighth pins are chip enable input pins CUE#, CE2 and CE1#. Eighty-third, eighty-fourth and eighty-fifth pins are burst control pins ADV#, ADSP# and ADSC#.

Eighty-eighth, eighty-seventh, ninety-third, ninety-fourth, ninetyfifth and ninety-sixth pins are write control input pins GW#, BWE#, BWa#, BWb#, BWc# and BWd#. An eighty-sixth pin is an output enable pin OE#, a sixty-fourth pin is a snooze mode (power sleep mode) input pin ZZ, a fourteenth pin is a flow-through input pin FT#, and a thirty-first pin is a linear burst input pin LBO#. Sixteenth, thirty-eighth, thirty-ninth, fortysecond, forty-third and sixty-sixth pins are non-connected pins NC.

FIG. 12 shows exemplary pin arrangement, and the forty-third non-connected pin NC is replaced with an address input pin in the case of 9 Mbits, for example. Further, any or all of the flow-through input pin FT#, the linear burst input pin LBO# and the snooze mode input pin ZZ may not be supported.

As shown in FIG. 13, the type 1 pipelined burst SRAM comprises control registers 21 and 22, a control logic circuit 23, logic circuits 27 and 28, a burst control logic circuit 24, an address register 25, a burst address counter 26, a memory cell array 30, a data input register 31, a data output register 34 and an output buffer 35.

The control register 21 captures burst control signals ADV# and ADSC# in synchronization with a clock signal CLK. The burst control logic circuit 24 captures a linear burst signal LBO# and the value of the control register 21 in synchronization with the clock signal CLK, and outputs an internal control signal for a burst operation.

The logic circuit 27 receives a burst control signal ADSP# and a chip enable signal CE1#. The logic circuit 28 receives chip enable signals CE1#, CE2 and CE3#.

The control register 22 captures outputs of the logic circuits 27 and 28 and write control signals GW#, BWE# and BWa# to BWd# in synchronization with the clock signal CLK.

The control logic circuit 23 receives the value of the control register 22, the output of the burst control logic circuit 24, an output enable signal OE# and a snooze mode signal ZZ and outputs a corresponding internal control signal.

The address register 25 captures addresses A0 to A16 in response to the output of the burst control logic circuit 24. The addresses A0 and A1 are output to the burst address counter 26. The burst address counter 26 outputs addresses A'0 and A'1 in response to control by the burst control logic circuit 24. A burst sequence (linear burst or interleaved) is selected with the linear burst signal LBO#.

The memory cell array 30 includes a plurality of memory cells arranged in rows and columns. A corresponding memory cell is selected on the basis of the output of the burst address counter 26 and the addresses A1 to A16 from the address register 25.

Data buses DB0 to DB35 are provided in correspondence to the data input/output pins DQa (eight), DQb (eight), DQc (eight) and DQd (eight) and the parity data input/output pins DQPa to DQPd respectively.

The data input register 31 captures data from the data buses in response to control by the control logic circuit 23. The data input register 31 captures data from the data input/output pins DQa with the write control signal BWa#, data from the data input/output pins DQb with the write control signal BWb#, data from the data input/output pins DQc with the write control signal BWc# and data from the data input/output pins DQd with the write control signal BWd#. The data captured in the data input register 31 are written in the selected memory cell.

The data output register 34 captures data read from the selected memory cell in response to control by the control logic circuit 23. The output buffer 35 outputs the data captured in the output register 34 to the data buses in response to control by the control logic circuit 23.

All input signals excluding the linear burst signal LBO#, the output enable signal OE# and the snooze mode signal ZZ are captured in synchronization with the clock signal CLK.

36-bit write operations are controlled with the write control signal GW#. The write operations are executed byte by byte with the write control signals BWa# to BWd# and BWE#. A burst operation is controlled with the burst control signal ADSC# or ADSP#. The burst control signal ADV# controls a burst address. A read operation is initialized with the burst control signal ADSP#.

The overall chip enters a power down mode with the snooze mode signal ZZ, for saving a standby current.

FIG. 14 illustrates pin arrangement of the synchronous network SRAM. Referring to FIG. 14, fifteenth, sixteenth, forty-first, sixty-fifth, sixty-sixth and ninety-first pins are power supply pins Vdd for an internal circuit, seventeenth, fortieth, sixty-seventh and ninetieth pins are ground power supply pins Vss for the internal circuit, fourth, eleventh, twentieth, twenty-seventh, fifty-fourth, sixty-first, seventieth and seventy-seventh pins are power supply pins VddQ for an output buffer, and fifth, tenth, twenty-first, twenty-sixth, fifty-fifth, sixtieth, seventy-first and seventy-sixth pins are ground power supply pins VssQ for the output buffer. An eighty-fifth pin is a burst control/burst start input pin ADV/LD#. Eighty-seventh and eighty-eighth pins are a cock enable input pin CKE# and a read/write control input pin RIW#.

The arrangement of data input/output pins DQa to DQd and DQPa to DQPd, address input pins A, A0 and A1, a clock input pin CLK and chip enable input pins CE3#, CE2 and CE1# is identical to that shown in FIG. 12.

The arrangement of write control input pins BWa#, BWb#, BWc# and BWd#, an output enable pin OE#, a snooze mode input pin ZZ, a flow-through input pin FT# and a linear burst input pin LBO# is identical to that shown in FIG. 12. Thirty-eighth, thirty-ninth, forty-second, fortythird, eighty-third and eighty-fourth pins are non-connected pins NC.

FIG. 14 shows exemplary pin arrangement, and the eighty-third non-connected pin NC is replaced with an address input pin in the case of 9 Mbits, for example. Further, any or all of the flow-through input pin FT#, the linear burst input pin LBO# and the snooze mode input pin ZZ may not be supported.

As shown in FIG. 15, the synchronous network SRAM includes control logic circuits 41 and 43, a control register 42, a logic circuit 44, an address register 45, a burst address counter 46, write address registers 47 and 48, multiplexers 49 and 53, a memory cell array 30, data input registers 51 and 52, a data output register 54 and an output buffer 55.

The control logic circuit 41 receives a clock signal CLK and a clock enable signal CKE# and outputs an internal clock K. The logic circuit 44 receives chip enable signals CE1#, CE2 and CE3#.

The control register 42 captures an output of the logic circuit 44, a burst control/burst start signal ADV/LD#, a read/write control signal R/W# and write control signals BWa# to BWd# in response to the internal clock K.

The control logic circuit 43 receives outputs of the control register 42, an output enable signal OE# and a snooze mode signal ZZ and outputs a corresponding internal control signal.

The address register 45 captures addresses A0 to A16 in synchronization with the internal clock K. The addresses A0 and A1 are output to the burst address counter 46. The burst address counter 46 outputs addresses A'0 and A'1 in response to a linear burst signal LBO#. A burst sequence (linear burst or interleaved) is selected with the linear burst signal LBO# for deciding the values of the addresses A'0 and A'1.

The write address register 47 captures the addresses A2 to A16 output from the address register 45 and the addresses A'0 and A'1 output from the burst address counter 46 in response to the internal clock K. The write address register 48 captures the value of the write address register 47 in response to the internal clock K.

The multiplexer 49 selectively outputs the values of the burst address counter 46 and the address register 45 or the value of the write address register 48 on the basis of control by the control logic circuit 43. A corresponding memory cell of the memory cell array 30 is selected on the basis of the output of the multiplexer 49.

The data input register 51 captures data from the data buses in synchronization with the internal clock K in response to control by the control logic circuit 43. The data input register 52 captures the data from the data input register 51 in synchronization with the internal clock K in response to control by the control logic circuit 43. The data captured by the data input register 52 are written in the selected memory cell.

The data output register 54 captures data read from the selected memory cell in synchronization with the internal clock K. The output buffer 53 outputs the data captured by the data output register 54 to the data buses in response to control by the control logic circuit 43.

All input signals excluding the linear burst signal LBO#, the output enable signal OE# and the snooze mode signal ZZ are captured in synchronization with the clock signal CLK.

Read and write operations are initialized with a burst control signal ADVILD#. The read or write operation is executed with a read/write control signal R/W#. Data are written byte by byte with the write control signals BWa# to BWd#.

While each of FIGS. 13 and 15 illustrates a single output buffer, 36 output buffers are provided in correspondence to the data buses DB0 to DB35 respectively in practice.

All input buffers (included in the control register 21, the address register 45 etc., for example) capturing the input signals are supplied with a power supply voltage VddQ from the power supply pins for the output buffers.

The aforementioned synchronous SRAM has two power sources for power Vdd for an internal circuit and input/output power VddQ. In general, the power Vdd is 3.3 V and the power VddQ is 2.5 V.

In this case, a standard high input/output level is the VddQ level and a standard low input/output level is 0 V. FIG. 16 shows an input buffer 90 employed for capturing an input signal.

The input buffer 90 shown in FIG. 16 includes PMOS transistors TP1 and TP2 and NMOS transistors TN1 and TN2. The transistors TP1 and TN1 are serially connected between the power VddQ and a ground power source, and the gates thereof receive the input signal. The transistors TP2 and TN2 are serially connected between the power VddQ and the ground power source, and the gates thereof are connected to a node N1 between the transistors TP1 and TN1.

A shift latch 92 includes PMOS transistors TP3 and TP4 and NMOS transistors TN3 and TN4. The transistors TP3 and TN3 are serially connected between the power Vdd and the ground power source. The transistors TP4 and TN4 are serially connected between the power Vdd and the ground power source. The gate of the transistor TN3 is connected to a node N2 between the transistors TP2 and TN2, and the gate of the transistor TP3 is connected to a node N4 between the transistors TP4 and TN4. The gate of the transistor TN4 is connected with the node N1, and the gate of the transistor TP4 is connected with a node N3 between the transistors TP3 and TN3. A signal from the node N4 is input in an internal circuit (not shown).

The input buffer 90 receives a signal of the CMOS level of 2.5 V in a CMOS inverter supplied with the power VddQ. The shift latch 92 amplifies an output of the input buffer 90 to the CMOS level of 3.3 V and transmits the amplified output to the internal circuit. When employing the input buffer 90, no through current flows since the CMOS inverter supplied with the power of 2.5 V receives the input signal of 2.5 V.

However, the aforementioned synchronous SRAM has a possibility of causing a malfunction as described below. This problem is now described.

In the aforementioned synchronous SRAM, 36 output buffers (referred to as output buffers 6#0 to 6#35) are connected with the power VddQ. FIG. 17 shows paths for supplying the power VddQ to half (18) output buffers 6#0 to 6#17 included in the synchronous SRAM shown in FIG. 12 or 14. Four VddQ pads P4, P11, P20 and P27 corresponding to four VddQ pins supply the power supply voltage VddQ to the output buffers 6#0 to 6#17 through a VddQ line L10. Thus, operations of the output buffers 6#0 to 6#17 are implemented.

In the read operation, however, all output buffers 6#0 to 6#35 simultaneously operate, to cause noise on the VddQ line L10. The relation between the situation of this noise and a malfunction is described with reference to FIGS. 18 and 19.

FIGS. 18 and 19 are timing charts for illustrating the problem of the conventional synchronous SRAM through generation timing of noise in the read operation. The cycle (clock cycle) of the clock signal CLK is 100 MHz in FIG. 18 and 200 MHz in FIG. 19. The access time of a standard synchronous SRAM is about 3 ns from rise of the clock signal CLK. In other words, large noise originates in the power VddQ in about 3 ns from the rise of the clock signal CLK.

When the power VddQ for the output buffer is used also for the input buffer 90, therefore, the input buffer 90 may malfunction or the operation thereof may be retarded while the power VddQ is noisy.

When the operating frequency is about 100 MHz, the input signal changes after the noise on the power VddQ is suppressed to some extent as shown in FIG. 18, to cause no problem in operation.

When the operating frequency approaches 200 MHz, however, the input buffer 90 processes the input signal while the power VddQ is noisy, as shown in FIG. 19. In the conventional structure, therefore, a problem in operation arises when the operating frequency is increased.

FIG. 20 shows another input buffer 95 employed for the synchronous SRAM. The input buffer 95 includes PMOS transistors TP5 and TP6 and NMOS transistors TN5 and TN6. The transistors TP5 and TN5 are serially connected between power Vdd and a ground power source, and the gates thereof receive an input signal. The transistors TP6 and TN6 are serially connected between the power Vdd and the ground power source, and the gates thereof are connected to a node N5 between the transistors TP5 and TN5. A signal from a node N6 between the transistors TP6 and TN6 is input in an internal circuit (not shown).

The input buffer 95 receives an input signal of the CMOS level of 2.5 V directly in a CMOS inverter supplied with the power Vdd. The input buffer 95 is supplied with no power VddQ, dissimilarly to the input buffer 90. Therefore, the input buffer 95 is resistant against noise originating in the power VddQ due to operation of an output buffer.

When the input signal is at the high level of 2.5 V, however, the PMOS transistor TP5 is not completely turned off, to disadvantageously result in flow of a through current. When the input signal is 1.8 V, a larger through current flows.

In the structure of the type 1 pipelined burst SRAM mainly employed at present or the synchronous network SRAM regarded as the main advanced semiconductor integrated device, therefore, it is difficult to increase the operating frequency.

A type 2 pipelined burst SRAM supplies power to an input circuit and an output circuit independently of each other. FIG. 21 shows pin arrangement of the type 2 pipelined burst SRAM. In the type 2 pipelined burst SRAM, VddI pins (thirty-eighth, forty-third, eighty-seventh and ninety-fourth pins), VddQ pins (fourth, eleventh, twentieth, twenty-seventh, fifty-fourth, sixty-first, seventieth and seventy-seventh pins) and Vdd pins (fifteenth, forty-first, sixty-fifth and ninety-first pins) are so arranged as to supply power VddI to an input buffer, power VddQ to an output buffer and power Vdd to an internal circuit respectively. In this case, the input buffer and the output buffer, individually supplied with the power VddI and the power VddQ respectively, can operate at a high frequency.

Fourteenth, sixteenth, sixty-fourth and sixty-sixth pins are data strobe output pins STRBA#, STRBA, STRBB and STRBB#, a ninety-third pin is a strobe clock input pin SCLK, an eighty-fourth pin is a reset input pin RESET #, and a ninety-sixth pin is a read latency selection input pin RDLAT4#.

However, the pin arrangement and the pin functions of the synchronous SRAM shown in FIG. 21 are different from those of the synchronous SRAMs shown in FIGS. 12 to 15. Therefore, the synchronous SRAM shown in FIG. 21 cannot be employed in place of the type 1 pipelined burst SRAM mainly employed at present or the synchronous network SRAM regarded as the main advanced semiconductor integrated device.

SUMMARY OF THE INVENTION

Accordingly, an object of the present invention is to provide a semiconductor integrated device guaranteed in stable operation regardless of the operating frequency while completely maintaining compatibility with the type 1 pipelined burst SRAM mainly employed at present or the synchronous network SRAM regarded as the main advanced semiconductor integrated device.

The semiconductor integrated circuit according to the present invention comprises an internal circuit, including a memory cell array, supplied with a first power supply voltage, an input circuit capturing a signal for executing a write/read operation of the memory cell array, an output circuit outputting data read from the memory cell array and a package, having 100 pins arranged on four side surfaces, enclosing the input circuit, the internal circuit and the output circuit, while a second power supply voltage is supplied to each of a fourth pin, an eleventh pin, a twentieth pin, a twenty-seventh pin, a fifty-fourth pin, a sixty-first pin, a seventieth pin and a seventy-seventh pin among the 100 pins, and the input circuit and the output circuit operate with supply of the second power supply voltage from different pins among the fourth pin, the eleventh pin, the twentieth pin, the twenty-seventh pin, the fifty-fourth pin, the sixtyfirst pin, the seventieth pin and the seventy-seventh pin.

According to the inventive semiconductor integrated device, therefore, power for an input system and that for an output system can be separated from each other while maintaining compatibility with pins of a conventional type 1 pipelined burst SRAM or synchronous network SRAM. Thus, the input circuit can process an input signal with no influence by noise originating from operation of the output circuit. Consequently, the input circuit can precisely operate also when an operating frequency is increased.

Preferably, the package is a quad flat package. In particular, 30 pins in total among the 100 pins, including the fourth pin, the eleventh pin, the twentieth pin and the twenty-seventh pin, are arranged on a first side surface of the package, and 30 pins in total including the fifty-fourth pin, the sixty-first pin, the seventieth pin and the seventy-seventy pin are arranged on a second side surface opposite to the first side surface.

In particular, at least any of the eleventh pin, the twentieth pin, the sixty-first pin and the seventieth pin is electrically connected with the input circuit. Alternatively, any of the fourth pin, the twenty-seventh pin, the fifty-fourth pin and the seventy-seventh pin is electrically connected with the input circuit.

According to the aforementioned semiconductor integrated circuit, therefore, a quad flat package can be employed for maintaining compatibility with the conventional synchronous SRAM.

A pin supplying the second power supply voltage, located on an end of either side surface of the package, is used as the power supply pin for the input circuit. Thus, the output circuit can operate at a high speed.

Preferably, the second power supply voltage is equal to a high potential level of each of the input in the input circuit and the output from the output circuit.

According to the aforementioned semiconductor integrated circuit, therefore, the power supply voltage for the input circuit and the output circuit can be set to the high potential level of the input in the input circuit and the output from the output circuit. Thus, compatibility with the conventional synchronous SRAM can be maintained while the input circuit can be brought into a structure suppressing a through current.

Preferably, the semiconductor integrated circuit further comprises a first line for connecting a pin for supplying the second power supply voltage to the input circuit with the input circuit and a second line for connecting a pin for supplying the second power supply voltage to the output circuit with the output circuit, and the first line and the second line are arranged in electrical isolation from each other.

According to the aforementioned semiconductor integrated circuit, the power supply line for the input circuit and the power supply line for the output circuit are completely isolated from each other, whereby the input circuit can process the input signal with no influence by noise originating from operation of the output circuit.

Preferably, the semiconductor integrated circuit further comprises a supply node for supplying an internal power supply voltage to the internal circuit and a voltage-down circuit stepping down the first power supply voltage in response to the potential difference between a node receiving a reference voltage and the supply node, and the node receiving the reference voltage is connected with a pin supplying the second power supply voltage to the input circuit.

In particular, the voltage-down circuit includes an operational amplifier detecting the difference between the reference voltage and the internal power supply voltage and a transistor electrically connecting a node receiving the first power supply voltage and the supply node with each other in response to an output of the operational amplifier.

According to the aforementioned semiconductor integrated device, the power supply voltage for the internal circuit can be stepped down with reference to the voltage received from the power supply pin for the input circuit. Thus, a stable power supply voltage for the internal circuit can be generated and it is possible to employ an advanced process having cost effectiveness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
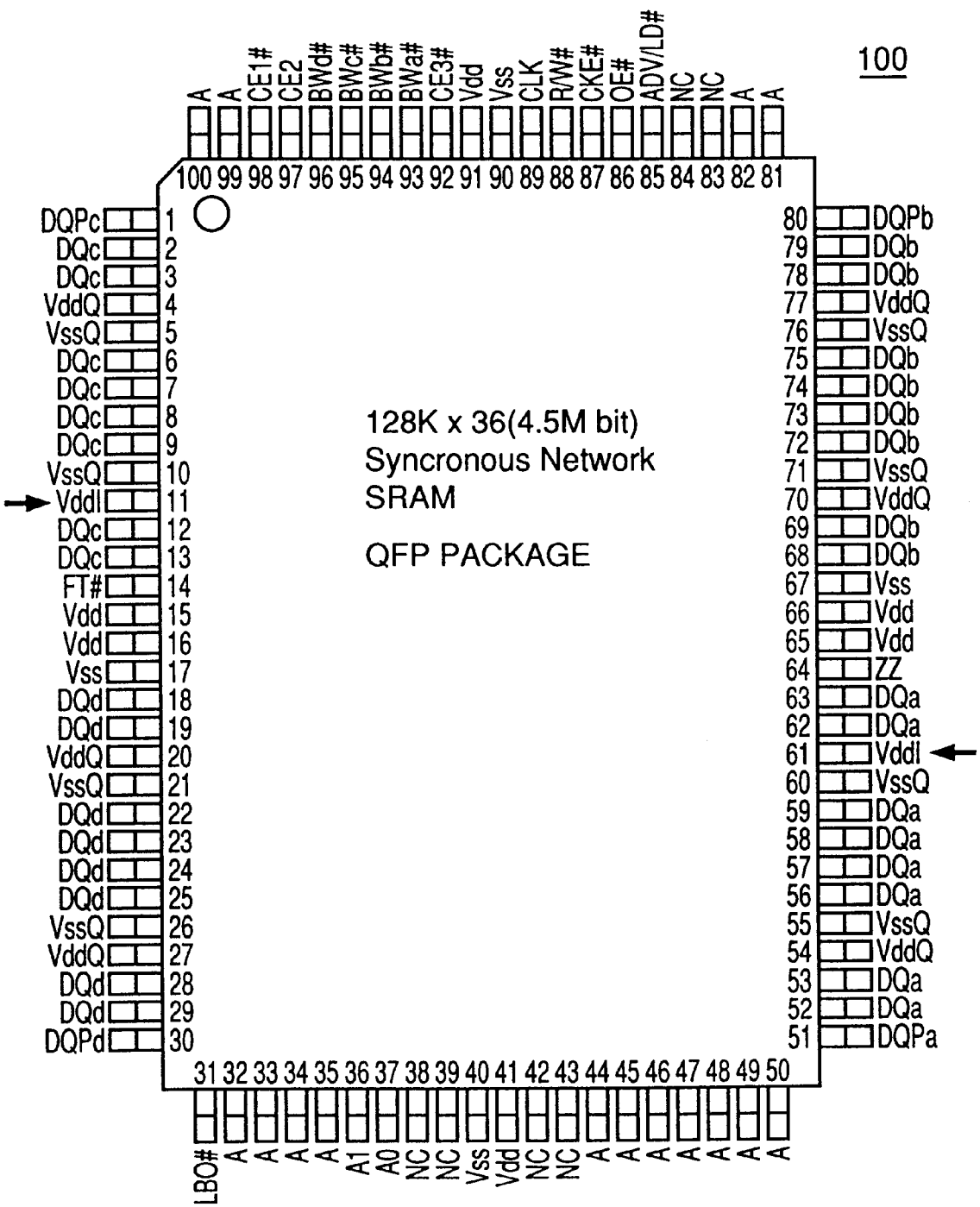
FIGS. 1 to 6 illustrate exemplary packages 100 to 600 in a synchronous SRAM according to a first embodiment of the present invention.

Embodiments of the present invention are now described with reference to the drawings. Referring to the drawings, identical or corresponding parts are denoted by the same reference numerals, and redundant description is not repeated.

[First Embodiment]

A semiconductor integrated circuit according to a first embodiment of the present invention is now described. The first embodiment of the present invention provides a synchronous SRAM provided with a dedicated power supply pin for an input buffer while maintaining compatibility with a conventional type 1 pipelined burst SRAM or synchronous network SRAM. More specifically, part (any of fourth, eleventh, twentieth, twenty-seventh, fifth-fourth, sixty-first, seventieth and seventy-seventh pins) of output buffer power supply pins VddQ is assigned to a power supply pin VddI for the input buffer. In order to maintain compatibility with the conventional synchronous SRAM, arrangement of pins other than the input buffer power supply pin VddI is matched with that of the conventional type 1 pipelined burst SRAM or synchronous network SRAM. The following description is made with reference to the synchronous network SRAM.

FIGS. 1 to 6 illustrate exemplary packages 100 to 600 of a synchronous SRAM according to the first embodiment of the present invention. FIGS. 1 to 6 are applied to the aforementioned synchronous network SRAM of 128 K×36 (4.5 Mbits). Each of the packages 100 to 600 is a quad flat package QFP, having 100 pins in total arranged on four side surfaces. First to thirtieth pins are arranged on a first side surface, fifty-first to eightieth pins are arranged on a second side surface opposite to the first side surface, thirty-first to fiftieth pins are arranged on a third side surface, and eighty-first to hundredth pins are arranged on a fourth side surface opposite to the third side surface respectively.

In the package 100 shown in FIG. 1, the eleventh pin and the sixty-first pin are employed as input buffer power supply pins VddI. The fifteenth pin, the sixteenth pin, the forty-first pin, the sixty-fifth pin, the sixty-sixth pin and the ninety-first pin are internal circuit power supply pins Vdd, the seventeenth pin, the fortieth pin, the sixty-seventh pin and the ninetieth pin are internal circuit ground power supply pins Vss, the fourth pin, the twentieth pin, the twenty-seventh pin, the fifth-fourth pin, the seventieth pin and the seventy-seventh pin are output buffer power supply pins VddQ, and the fifth pin, the tenth pin, the twenty-first pin, the twenty-sixth pin, the fifty-fifth pin, the sixtieth pin, the seventy-first pin and the seventy-sixth pin are output buffer ground power supply pins VssQ.

Figure 2:
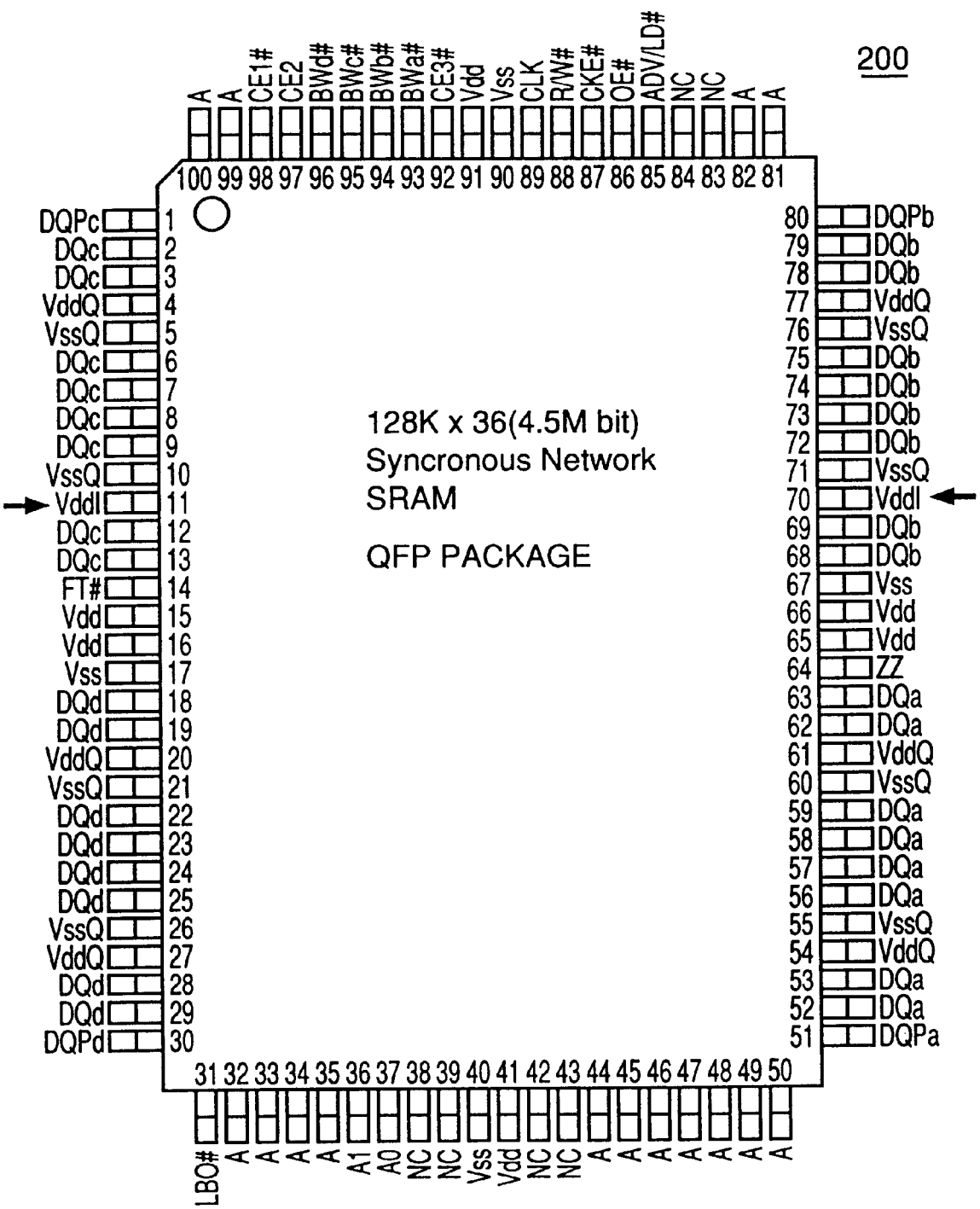

In the package 200 shown in FIG. 2, the eleventh pin and the seventieth pin are employed as input buffer power supply pins VddI. The fifteenth pin, the sixteenth pin, the forty-first pin, the sixty-fifth pin, the sixty-sixth pin and the ninety-first pin are internal circuit power supply pins Vdd, the seventeenth pin, the fortieth pin, the sixty-seventh pin and the ninetieth pin are internal circuit ground power supply pins Vss, the fourth pin, the twentieth pin, the twenty-seventh pin, the fifth-fourth pin, the sixty-first pin and the seventy-seventh pin are output buffer power supply pins VddQ, and the fifth pin, the tenth pin, the twenty-first pin, the twenty-sixth pin, the fifty-fifth pin, the sixtieth pin, the seventy-first pin and the seventy-sixth pin are output buffer ground power supply pins VssQ.

Figure 3:
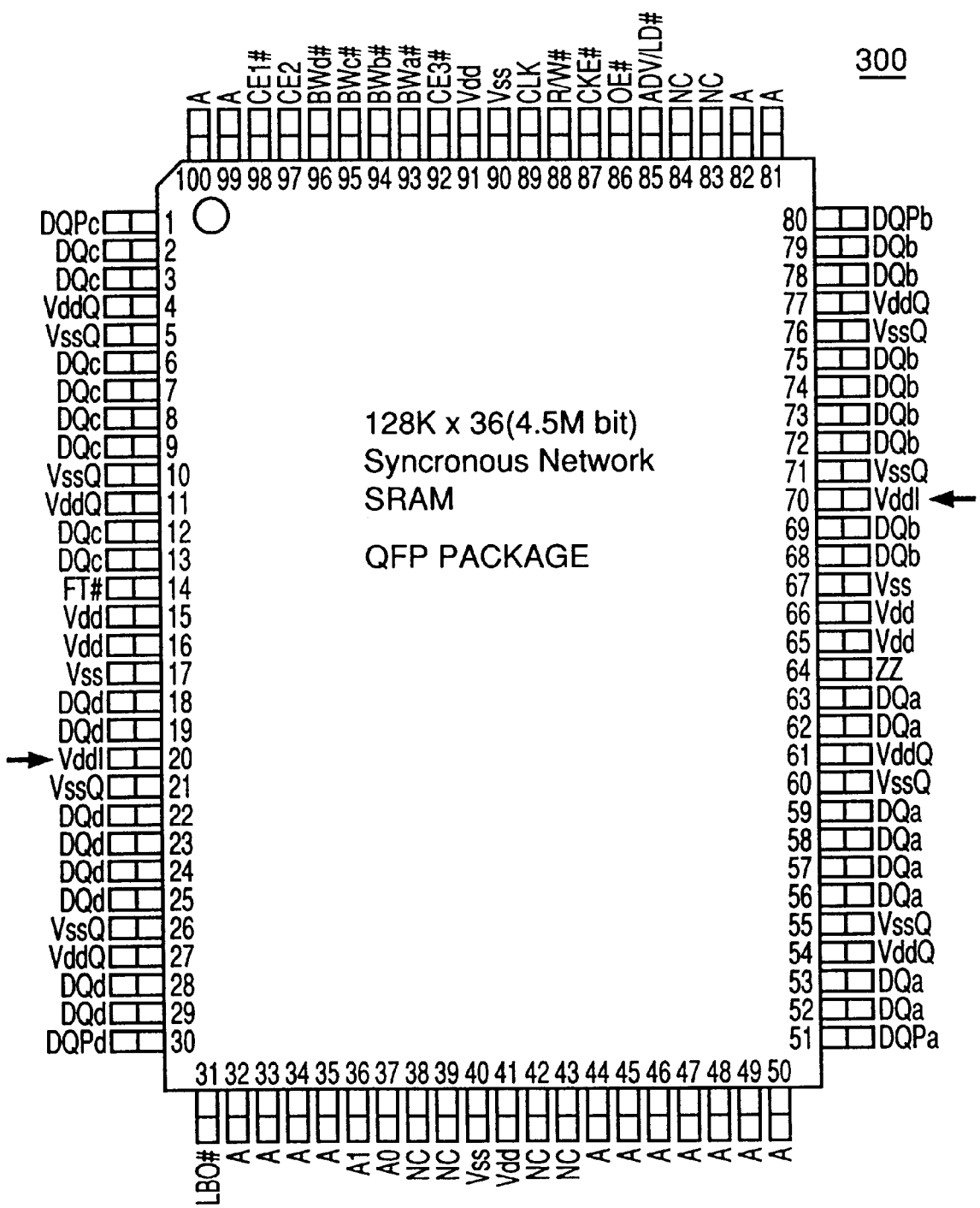

In the package 300 shown in FIG. 3, the twentieth pin and the seventieth pin are employed as input buffer power supply pins VddI. The fifteenth pin, the sixteenth pin, the forty-first pin, the sixty-fifth pin, the sixty-sixth pin and the ninety-first pin are internal circuit power supply pins Vdd, the seventeenth pin, the fortieth pin, the sixty-seventh pin and the ninetieth pin are internal circuit ground power supply pins Vss, the fourth pin, the eleventh pin, the twenty-seventh pin, the fifth-fourth pin, the sixty-first pin and the seventy-seventh pin are output buffer power supply pins VddQ, and the fifth pin, the tenth pin, the twenty-first pin, the twenty-sixth pin, the fifty-fifth pin, the sixtieth pin, the seventy-first pin and the seventy-sixth pin are output buffer ground power supply pins VssQ.

Figure 4:
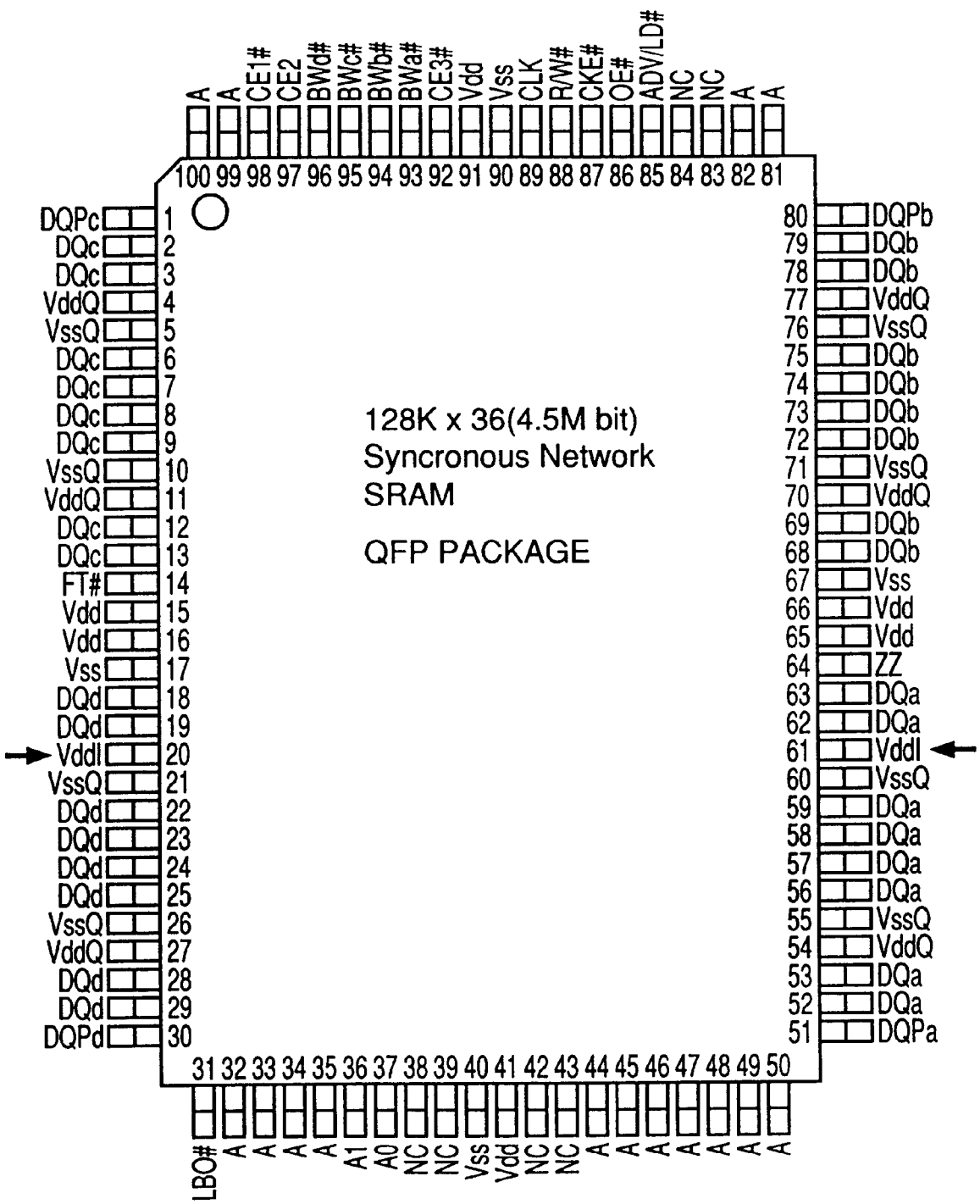

In the package 400 shown in FIG. 4, the twentieth pin and the sixtyfirst pins are employed as input buffer power supply pins VddI. The fifteenth pin, the sixteenth pin, the forty-first pin, the sixty-fifth pin, the sixty-sixth pin and the ninety-first pin are internal circuit power supply pins Vdd, the seventeenth pin, the fortieth pin, the sixty-seventh pin and the ninetieth pin are internal circuit ground power supply pins Vss, the fourth pin, the eleventh pin, the twenty-seventh pin, the fifth-fourth pin, the seventieth pin and the seventy-seventh pin are output buffer power supply pins VddQ, and the fifth pin, the tenth pin, the twenty-first pin, the twenty-sixth pin, the fifty-fifth pin, the sixtieth pin, the seventy-first pin and the seventy-sixth pin are output buffer ground power supply pins VssQ.

Figure 5:
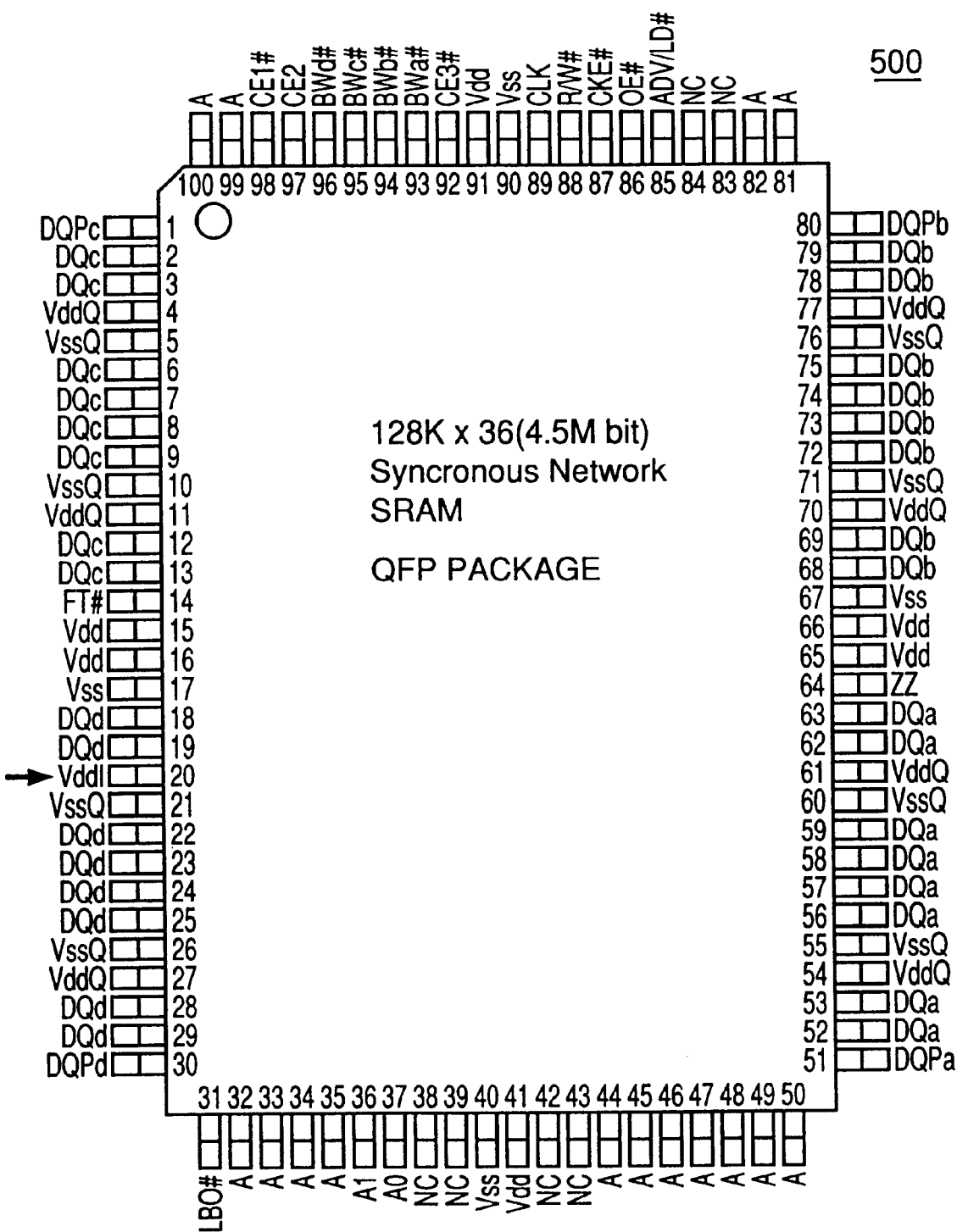

In the package 500 shown in FIG. 5, the twentieth pin is employed as an input buffer power supply pin VddI. The fifteenth pin, the sixteenth pin, the forty-first pin, the sixty-fifth pin, the sixty-sixth pin and the ninety-first pin are internal circuit power supply pins Vdd, the seventeenth pin, the fortieth pin, the sixty-seventh pin and the ninetieth pin are internal circuit ground power supply pins Vss, the fourth pin, the eleventh pin, the twenty-seventh pin, the fifth-fourth pin, the sixty-first pin, the seventieth pin and the seventy-seventh pin are output buffer power supply pins VddQ, and the fifth pin, the tenth pin, the twenty-first pin, the twenty-sixth pin, the fifty-fifth pin, the sixtieth pin, the seventy-first pin and the seventy-sixth pin are output buffer ground power supply pins VssQ.

Figure 6:
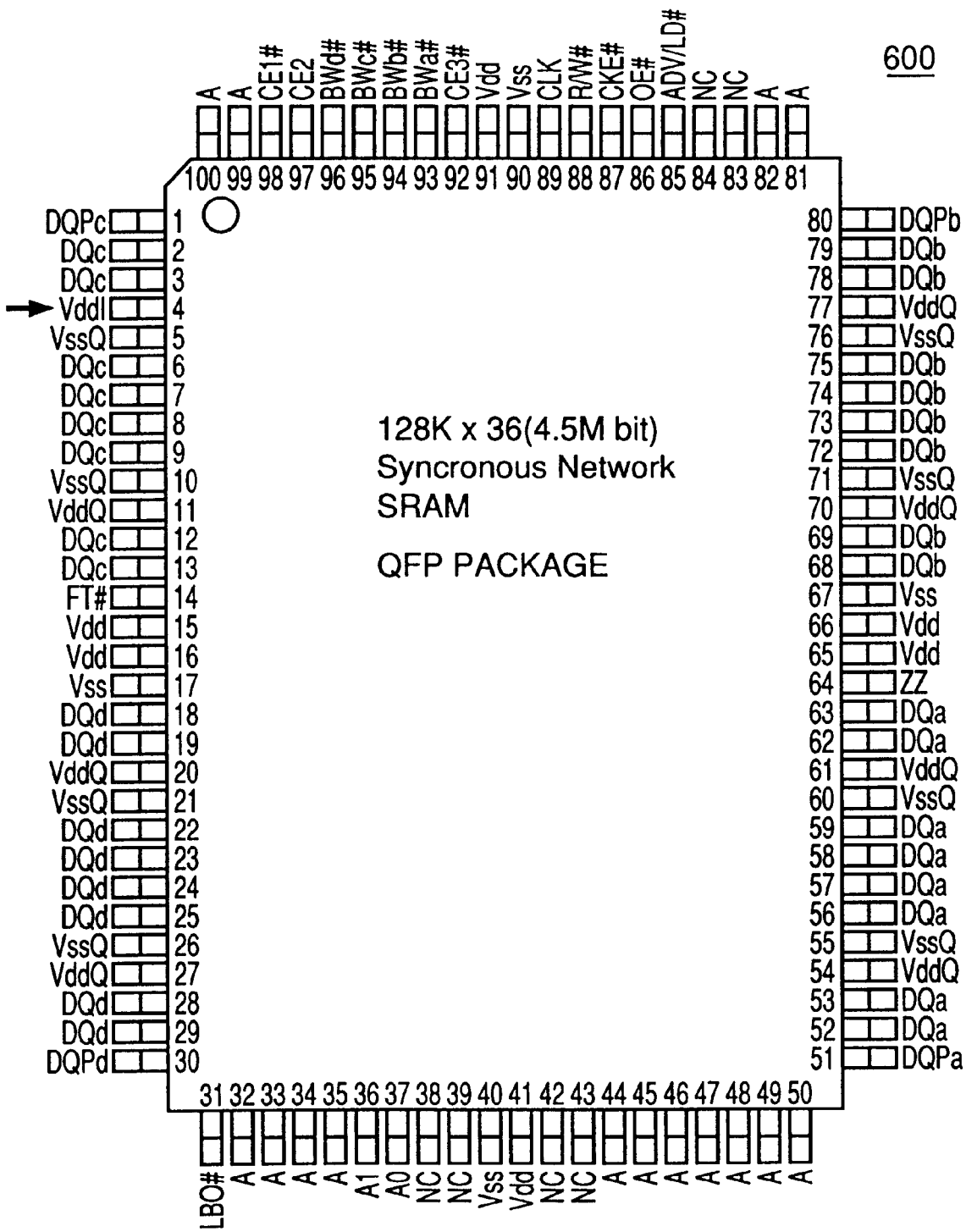

In the package 600 shown in FIG. 6, the fourth pin is employed as an input buffer power supply pin VddI. The fifteenth pin, the sixteenth pin, the forty-first pin, the sixty-fifth pin, the sixty-sixth pin and the ninety-first pin are internal circuit power supply pins Vdd, the seventeenth pin, the fortieth pin, the sixty-seventh pin and the ninetieth pin are internal circuit ground power supply pins Vss, the twentieth pin, the eleventh pin, the twenty-seventh pin, the fifth-fourth pin, the sixty-first pin, the seventieth pin and the seventy-seventh pin are output buffer power supply pins VddQ, and the fifth pin, the tenth pin, the twenty-first pin, the twenty-sixth pin, the fifty-fifth pin, the sixtieth pin, the seventy-first pin and the seventysixth pin are output buffer ground power supply pins VssQ.

The input buffer power supply pins VddI shown in FIGS. 1 to 6 are supplied with power VddI of the same potential as power VddQ supplied from the output buffer power supply pins VddQ. Ground power for the input buffer is not restricted in particular. For example, ground power for output buffers or ground power for an internal circuit is employed. Alternatively, either power is employed as ground power dedicated to the input buffer.

The synchronous SRAM according to the first embodiment of the present invention has the aforementioned basic structure. The input buffer power supply pin(s) VddI and the output buffer power supply pins VddQ are individually arranged and hence an input buffer 2 shown in FIG. 7 can be arranged. The input buffer 2 is an example corresponding to an input buffer receiving a clock signal CLK, for example.

The input buffer 2 includes PMOS transistors TP7 and TP8 and NMOS transistors TN7 and TN8. The transistors TP7 and TN7 are serially connected between the power VddI and the ground power, and the gates thereof receive an input signal. The transistors TP8 and TN8 are serially connected between the power VddI and the ground power, and the gates thereof are connected with a node N10 between the transistors TP7 and TN7.

A node N11 between the transistors TP8 and TN8 is connected with the gate of a transistor TN3 of a shift latch 92, and the node N10 between the transistors TP7 and TN7 is connected with the gate of a transistor TN4 of the shift latch 92.

The input buffer 2 receives the input signal in a CMOS inverter supplied with the power VddI. The shift latch 92 converts the input signal of a CMOS level having an amplitude VddI (VddQ) to a CMOS-level signal having an amplitude Vdd, and outputs this signal to the internal circuit.

Figure 7:
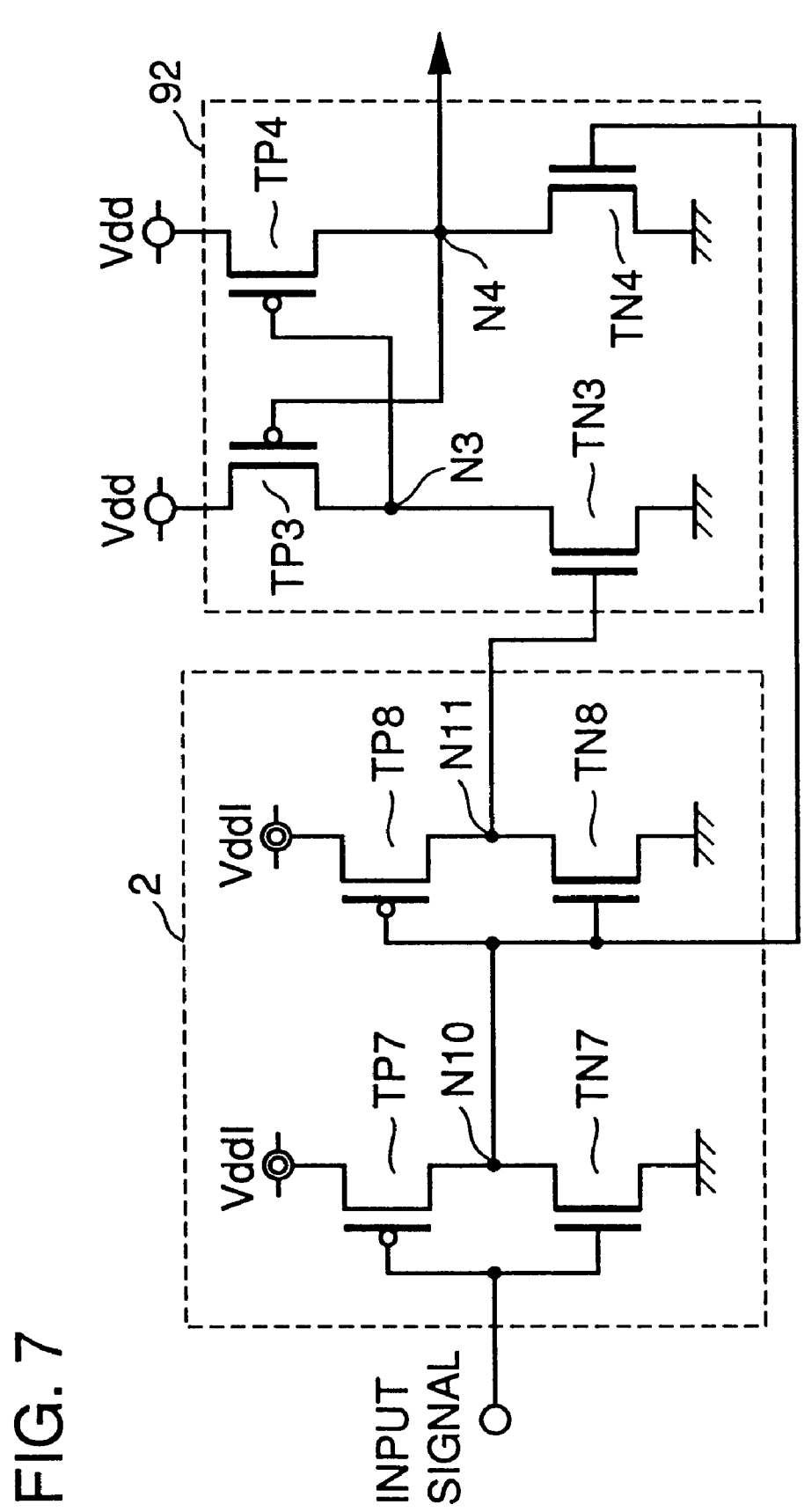
FIG. 7 is a circuit diagram for illustrating an exemplary input buffer 2 in the synchronous SRAM according to the first embodiment of the present invention.

According to the structure shown in FIG. 7, a through current can be suppressed for a low-level input signal of 2.5 V or 1.8 V.

The power VddI is connected to only the CMOS part of the input buffer 2 and a flowing current is extremely small. Therefore, one or two VddI pins for supplying the power VddI may be provided.

Figure 8:
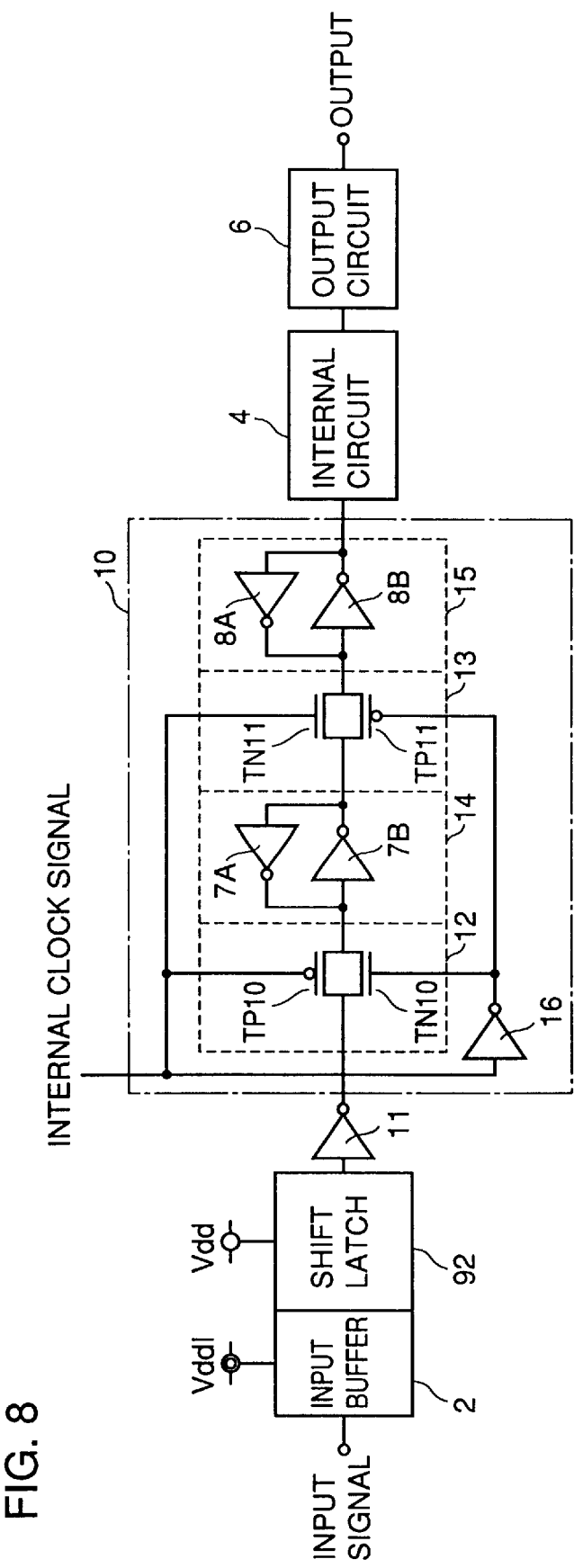
FIG. 8 illustrates the input buffer 2 and an exemplary input register 10.

The outline of the flow of the input signal captured in the input buffer 2 is described with reference to FIG. 8. FIG. 8 representatively illustrates the relation with an input register (corresponding to the address register 45 or the control register 42, for example) 10 capturing an external signal in response to a clock signal.

The input register 10 receives a signal obtained by inverting a signal from an output node N4 of the shift latch 92 by an inverter 11 as an input. The input register 10 includes a transfer gate 12 formed by a PMOS transistor TP10 and an NMOS transistor TN 10, a transfer gate 13 formed by a PMOS transistor TP11 and an NMOS transistor TN11, a latch 14 formed by inverters 7A and 7B, and a latch 15 formed by inverters 8A and 8B.

The transistors TP10 and TN11 receive an internal clock signal (an output K from the control logic circuit 41, for example) in the gates thereof. The transistors TP11 and TN10 receive a signal obtained by inverting the internal clock signal by an inverter 16 in the gates thereof.

In response to the internal clock signal, the output signal of the shift latch 92 is successively transferred to the latches 14 and 15. The value of the latch 15 is transferred to an internal circuit 4 including a memory cell array. The internal circuit 4 operates in response to the signal input therein. An output circuit 6 outputs data read from the memory cell array.

Figure 9:
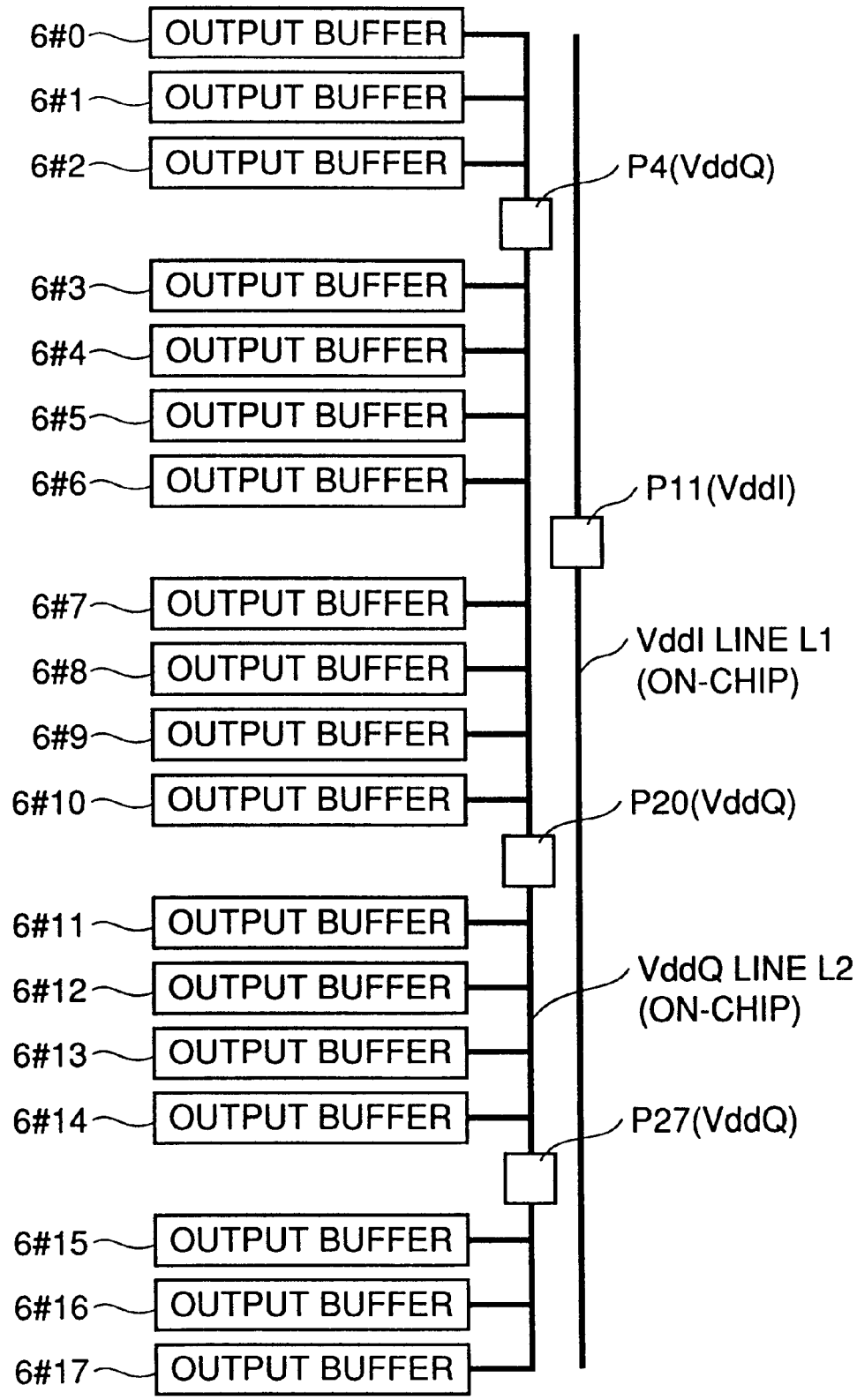
FIG. 9 is a diagram for illustrating exemplary relation between a line supplying power VddI and a line supplying power VddQ.

Exemplary relation between a line supplying the power supply voltage VddI and a line supplying the power supply voltage VddQ is now described with reference to FIG. 9. While the synchronous SRAM has 36 output buffers (6#0 to 6#35) for data buses DB0 to DB35 respectively, FIG. 9 representatively shows 18 output buffers 6#0 to 6#17. The output buffers 6#0 to 6#17 are aligned with each other along the pin arrangement.

A VddI line L1 is provided on-chip, for connecting a pad (VddI pad) corresponding to the VddI pins with an input buffer (not shown). A VddQ line L2 is provided on-chip, for connecting pads (VddQ pads) corresponding to the VddQ pins with the output buffers.

Referring to FIG. 9, pads P4, P20 and P27 corresponding to the fourth pin, the twentieth pin and the twenty-seventh pin respectively supply the power supply voltage VddQ to the VddQ line L2, while a pad P11 corresponding to the eleventh pin supplies the power supply voltage VddI to the VddI line L1. This arrangement relation is applied to the aforementioned packages 100 to 500, for example.

The pad P4 is located in the vicinity of the output buffers 6#2 and 6#3. The pad P20 is located in the vicinity of the output buffers 6#10 and 6#11. The pad P27 is located in the vicinity of the output buffers 6#14 and 6#15. The output buffers 6#0 to 6#17 operate with supply of the power supply voltage VddQ from the VddQ line L2.

The VddQ line L2 and the VddI line L1 are separately provided independently of each other, as shown in FIG. 9. Thus, the input buffer can be prevented from a malfunction resulting from transmission of noise originating in the power VddQ in a read operation to the VddI line L1.

A VddQ line supplying the power VddQ to the output buffers 6#18 to 6#35 (not shown) is also separated from the VddI line.

Figure 10:
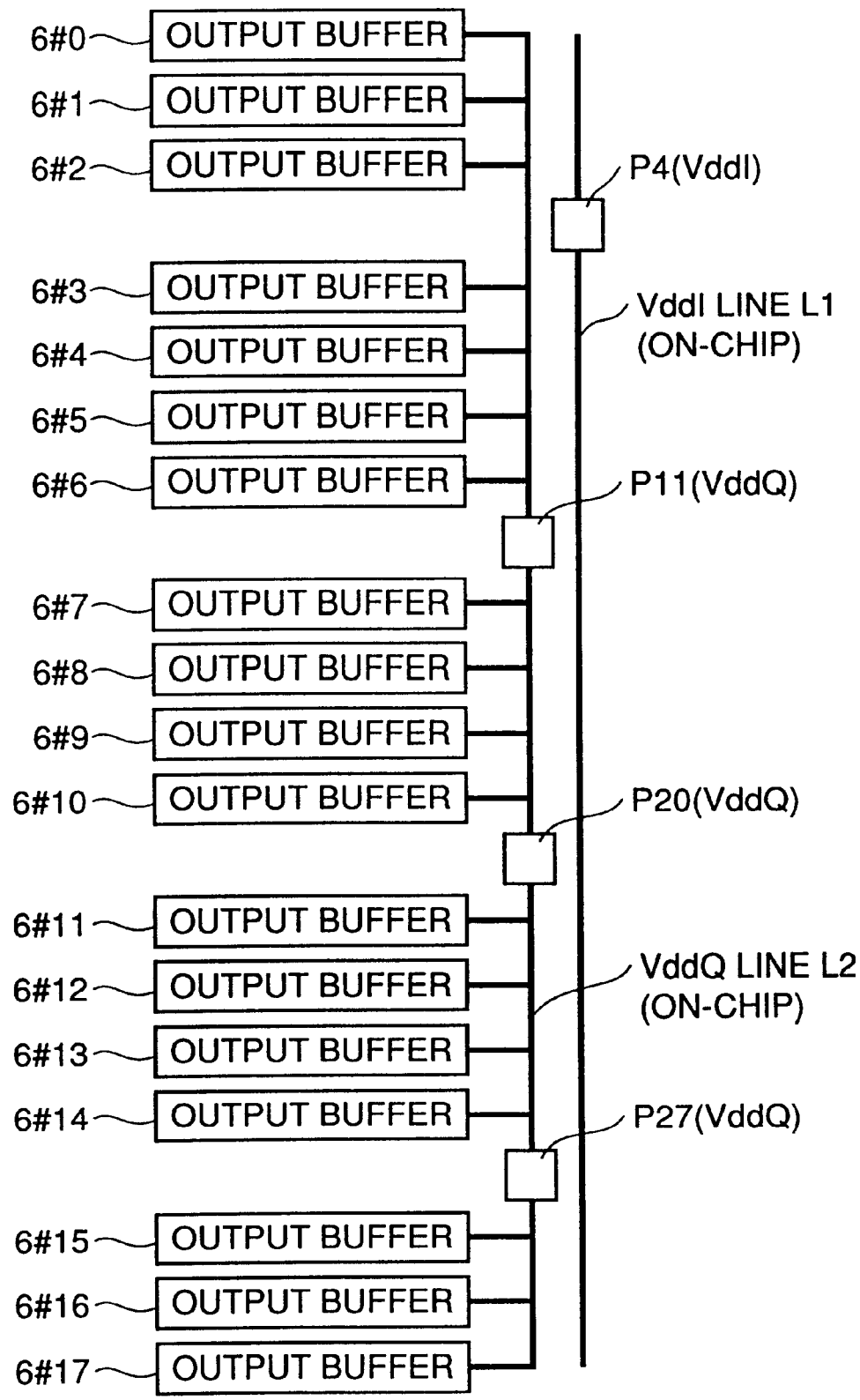
FIG. 10 is a diagram for illustrating another exemplary relation between the line supplying the power VddI and the line supplying the power VddQ.

Another exemplary relation between the VddI line L1 and the VddQ line L2 is described with reference to FIG. 10. FIG. 10 representatively shows half output buffers 6#0 to 6#17 among the 36 output buffers 6#0 to 6#35. The output buffers 6#0 to 6#17 are aligned with each other along the pin arrangement.

Referring to FIG. 10, the pads P11, P20 and P27 corresponding to the eleventh pin, the twentieth pin and the twenty-seventh pin respectively supply the power supply voltage VddQ to the VddQ line L2, and the pad P4 corresponding to the fourth pin supplies the power supply voltage VddI to the VddI line L1. This arrangement relation is applied to the aforementioned package 600, for example.

The pad P11 is located in the vicinity of the output buffers 6#6 and 6#7. The pad P20 is located in the vicinity of the output buffers 6#10 and 6#11. The pad P27 is located in the vicinity of the output buffers 6#14 and 6#15. The output buffers 6#0 to 6#17 operate with supply of the power supply voltage VddQ from the VddQ line L2.

Also in this case, the VddQ line L2 and the VddI line L1 are separately provided independently of each other. Thus, the input buffer can be prevented from a malfunction resulting from transmission of noise originating in the power VddQ in a read operation to the VddI line L1.

The VddQ line supplying the power VddQ to the output buffers 6#18 to 6#35 (not shown) is also separated from the VddI line.

The structures shown in FIGS. 9 and 10 are different from each other in the positions of the VddI pads. Therefore, the number of output buffers corresponding to a single VddQ pad is different. In the structure shown in FIG. 9, currents in reading flow to the pad P4 from seven output buffers 6#0 to 6#6 in total. In the structure shown in FIG. 10, currents in reading flow to the pad P11 from nine output buffers 6#0 to 6#8 in total.

The pins and the pads are connected by frame wiring and wire bonding, and parasitic resistance and parasitic inductance exist on the paths between the pins and the pads. When the voltage of the VddQ line is reduced due to the parasitic resistance or the parasitic inductance between the VddQ pins and the pads, outputs from the output buffers in the read operation are retarded.

Comparing the structure shown in FIG. 9 with the structure shown in FIG. 10, larger currents flow from the output buffers to the pad P11 corresponding to the power VddQ shown in FIG. 10 in the read operation as compared with the pad P4 corresponding to the power VddQ shown in FIG. 9. The structure shown in FIG. 9 is less influenced by the parasitic resistance or the parasitic inductance. Thus, it can be said that the structure shown in FIG. 9 is superior to the structure shown in FIG. 10 in the operating speed of the output buffers.

Thus, the synchronous SRAM according to the first embodiment of the present invention can prevent a malfunction by separating the power for the output buffers from that for the input buffer while maintaining compatibility with the conventional synchronous network SRAM.

While the above description has been made with reference to the synchronous network SRAM comprising the package having 100 pins arranged on the four side surfaces, the present invention is not restricted to this. The present invention is also applicable to the conventional type 1 pipelined burst SRAM having 100 pins arranged on the four side surfaces. In this case, any of the fourth pin, the eleventh pin, the twentieth pin, the twenty-seventh pin, the fifty-fourth pin, the sixty-first pin, the seventieth pin and the seventy-seventh pin forming the VddQ pins of the type 1 pipelined burst SRAM is assigned to the input buffer power supply pin VddI. The remaining pin arrangement is matched with that of the conventional type 1 pipelined burst SRAM. The power VddQ and the power VddI are set to the same voltage. The VddI line and the VddQ line are separately provided. Thus, a malfunction can be prevented by separating the power for the output buffers from that for the input buffer while maintaining compatibility with the conventional type 1 pipelined burst SRAM.

[Second Embodiment]

A synchronous SRAM according to a second embodiment of the present invention is now described. When applying a wafer process advanced by one generation to a synchronous SRAM having two power sources for power Vdd supplied to an internal circuit and input/output circuit power VddQ deciding the input/output level of the SRAM, an internal voltage-down circuit is necessary.

More specifically, a 0.4 μm process optimized to power of 3.3 V has been employed for an initial product of synchronous SRAM. At present, production of a synchronous SRAM employing a 0.25 μm process optimized to power of 2.5 V is progressed in order to reduce the chip size and improve cost effectiveness.

While a product of the 0.25 μm process must maintain compatibility with the initial product, reliability for the internal circuit cannot be ensured unless the power of 2.5 V is employed. Therefore, an internal voltage-down circuit is arranged in the product of the 0.25 μm process for internally stepping down externally supplied power of 3.3 V to 2.5 V and thereafter supplying the stepped-down voltage to the internal circuit.

In the synchronous SRAM according to the second embodiment of the present invention, therefore, an internal voltage-down circuit 20 is arranged for supplying a stable proper operating power supply voltage to an internal circuit, in addition to the structure according to the first embodiment. The internal voltage-down circuit 20 is described with reference to FIG. 11.

The internal voltage-down circuit 20 includes an operational amplifier 21 receiving an internal power supply voltage int-Vdd and a reference potential ref in its input and a PMOS transistor TP20 connected between a power supply node supplying power Vdd and a power supply node N20. The transistor TP20 is turned on in response to an output of the operational amplifier 21. The operational amplifier 21 controls the gate voltage of the transistor TP20 so that the reference potential ref and the internal power supply voltage int-Vdd are equal to each other.

Figure 11:
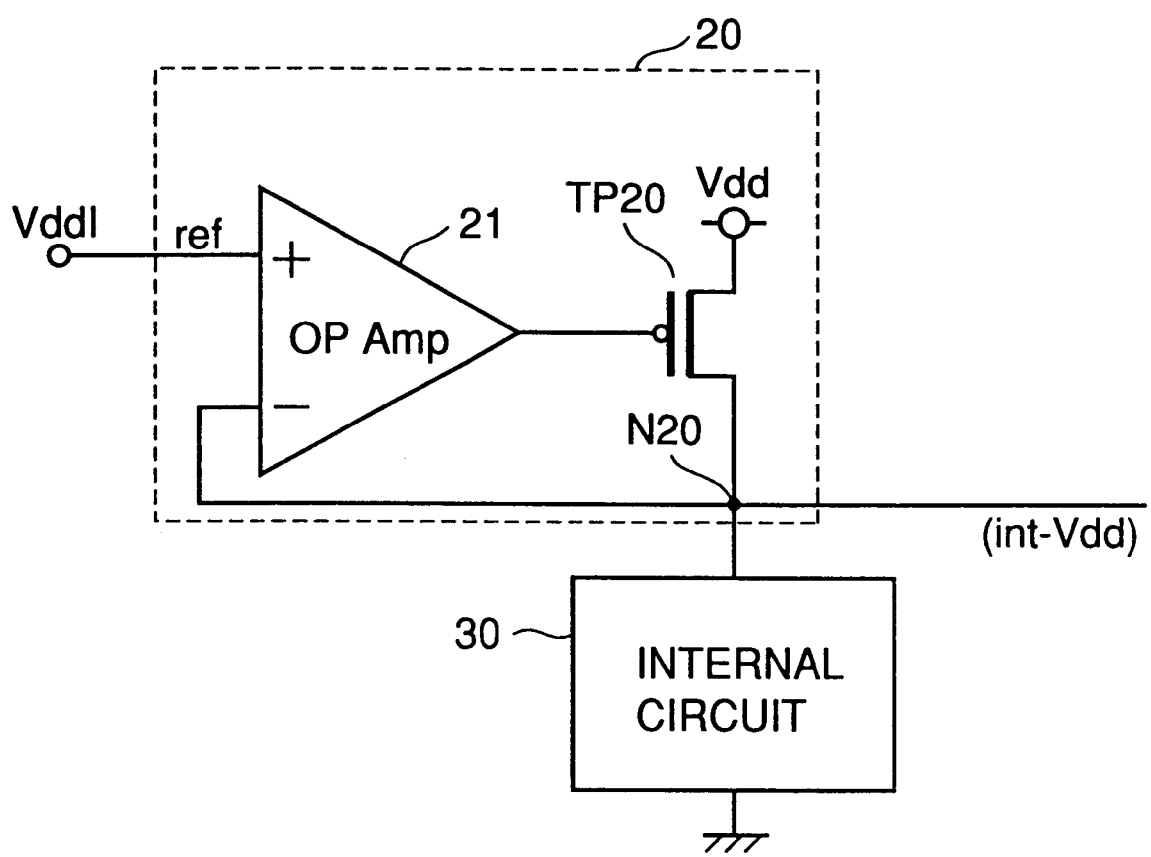
FIG. 11 is a diagram for illustrating an internal voltage-down circuit 20 included in a synchronous SRAM according to a second embodiment of the present invention.
Figure 12:
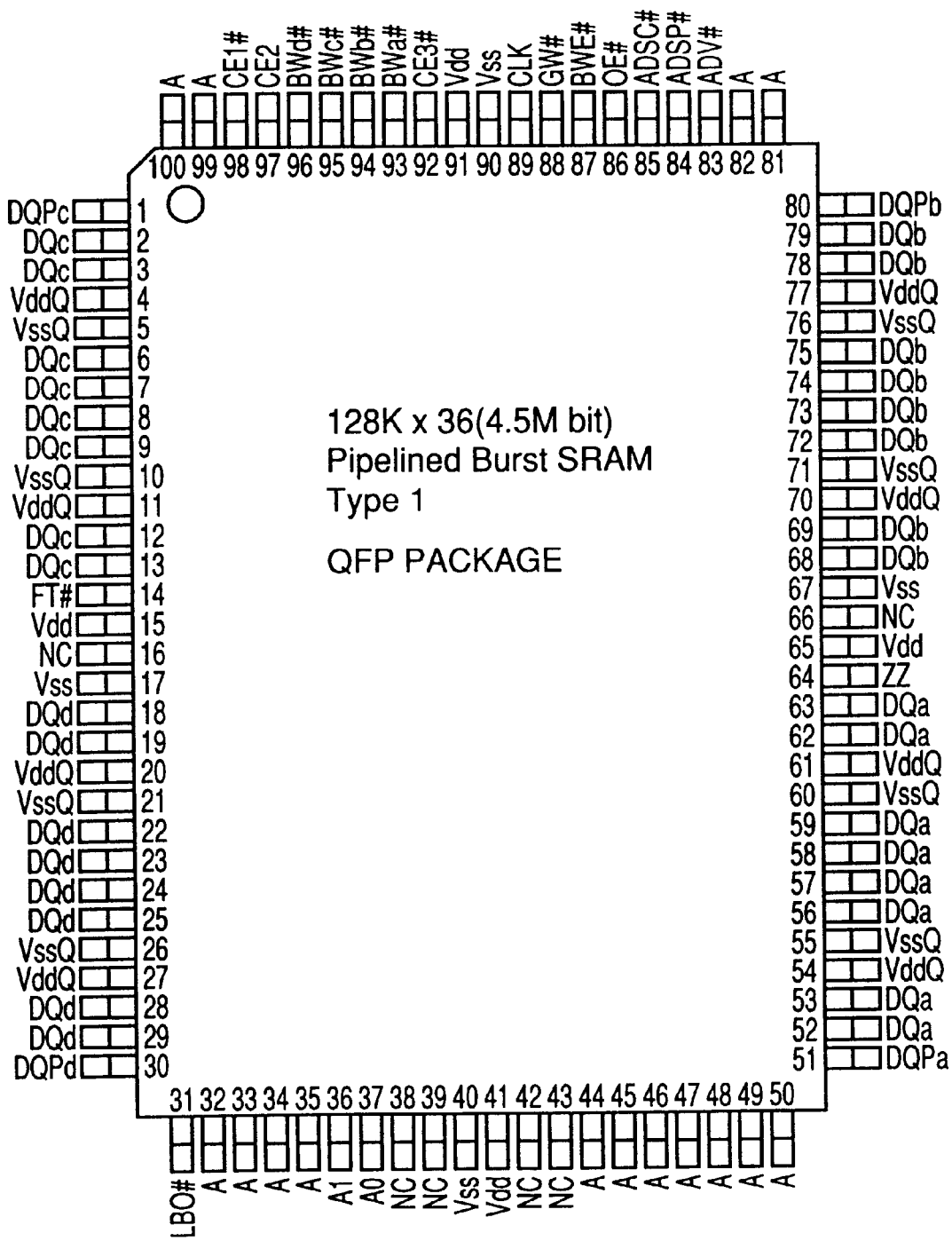
FIG. 12 illustrates exemplary pin arrangement of a type 1 pipelined burst SRAM.
Figure 13:
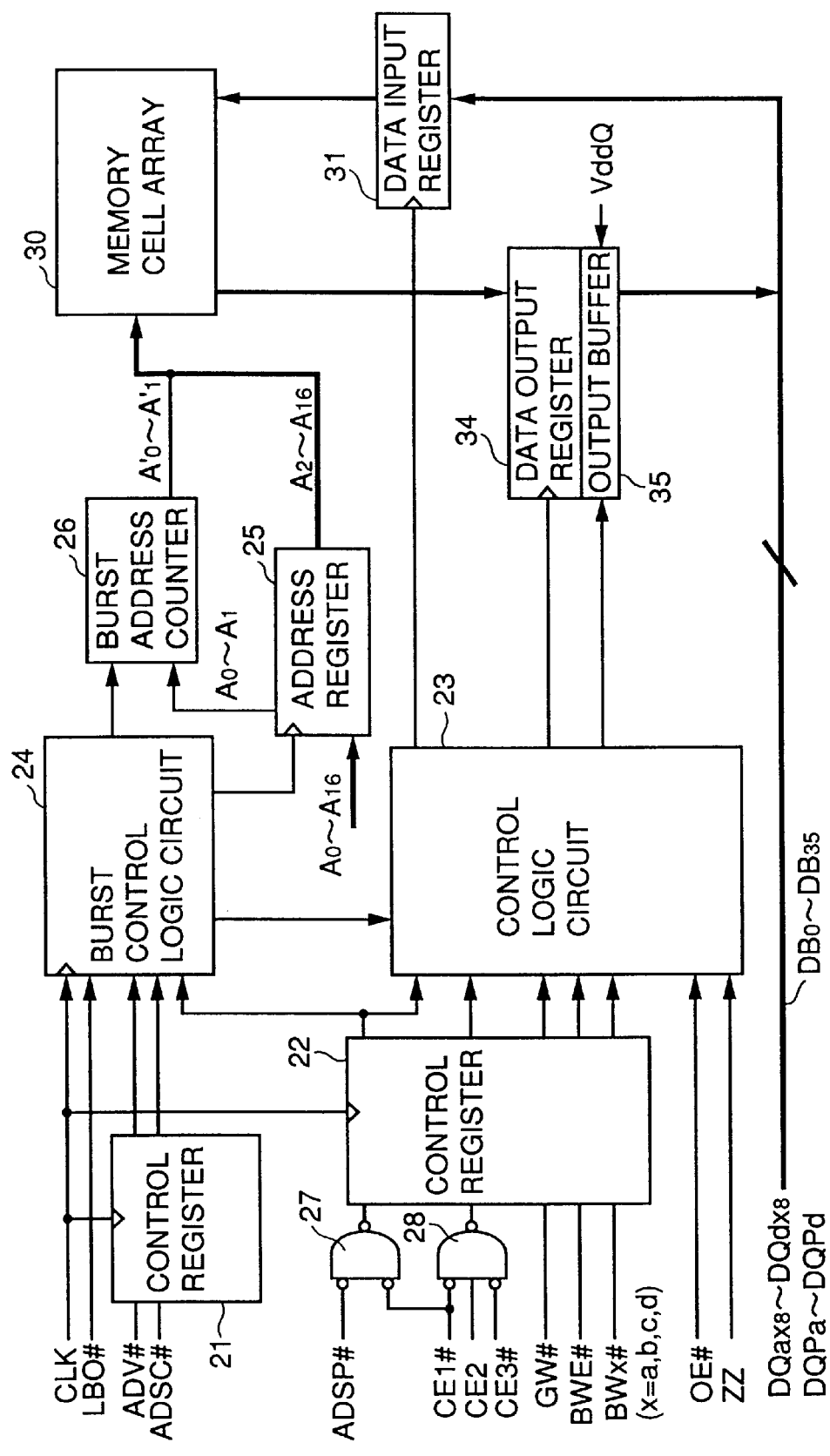
FIG. 13 illustrates an exemplary structure of the type 1 pipelined burst SRAM.
Figure 14:
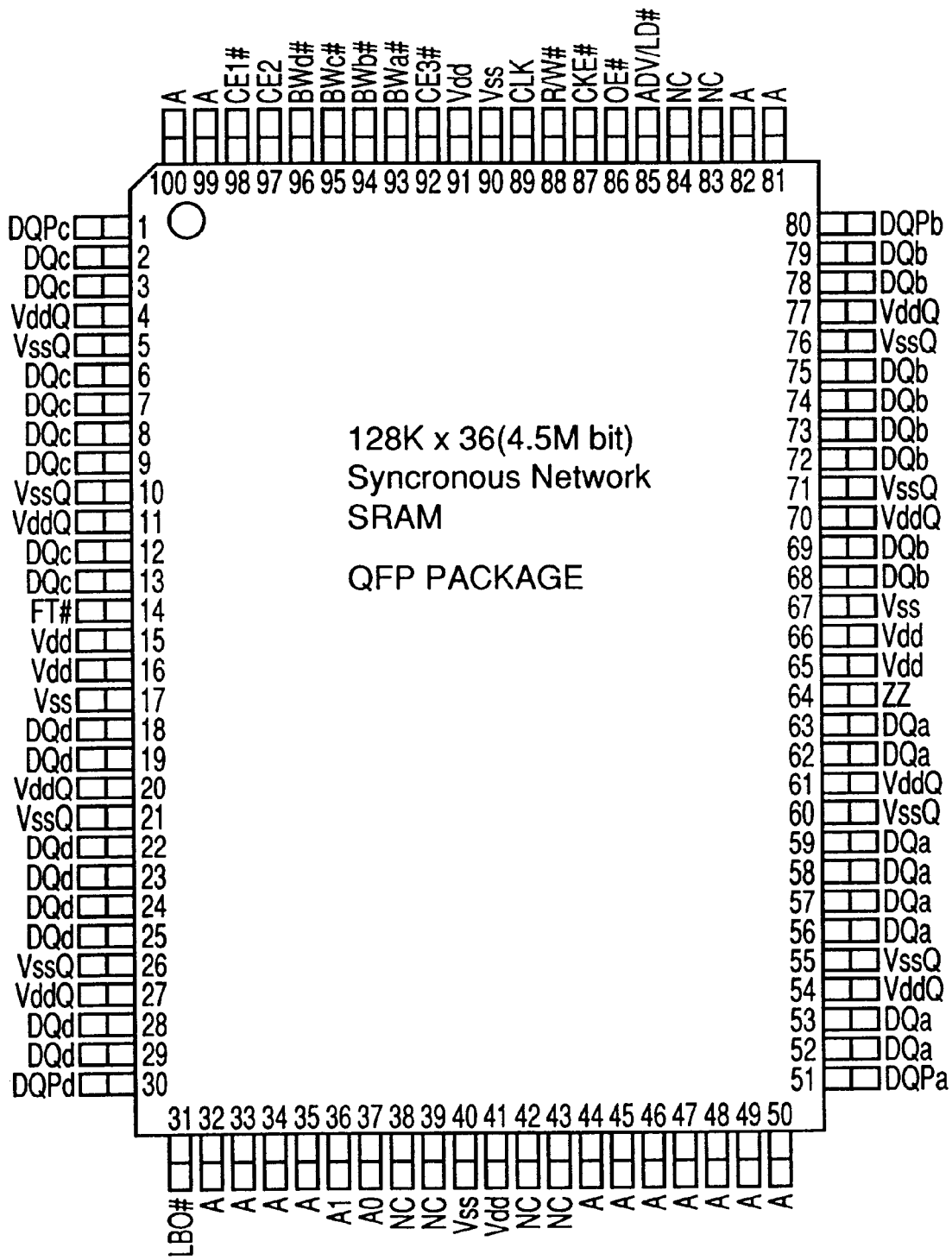
FIG. 14 illustrates exemplary pin arrangement of a synchronous network SRAM.
Figure 15:
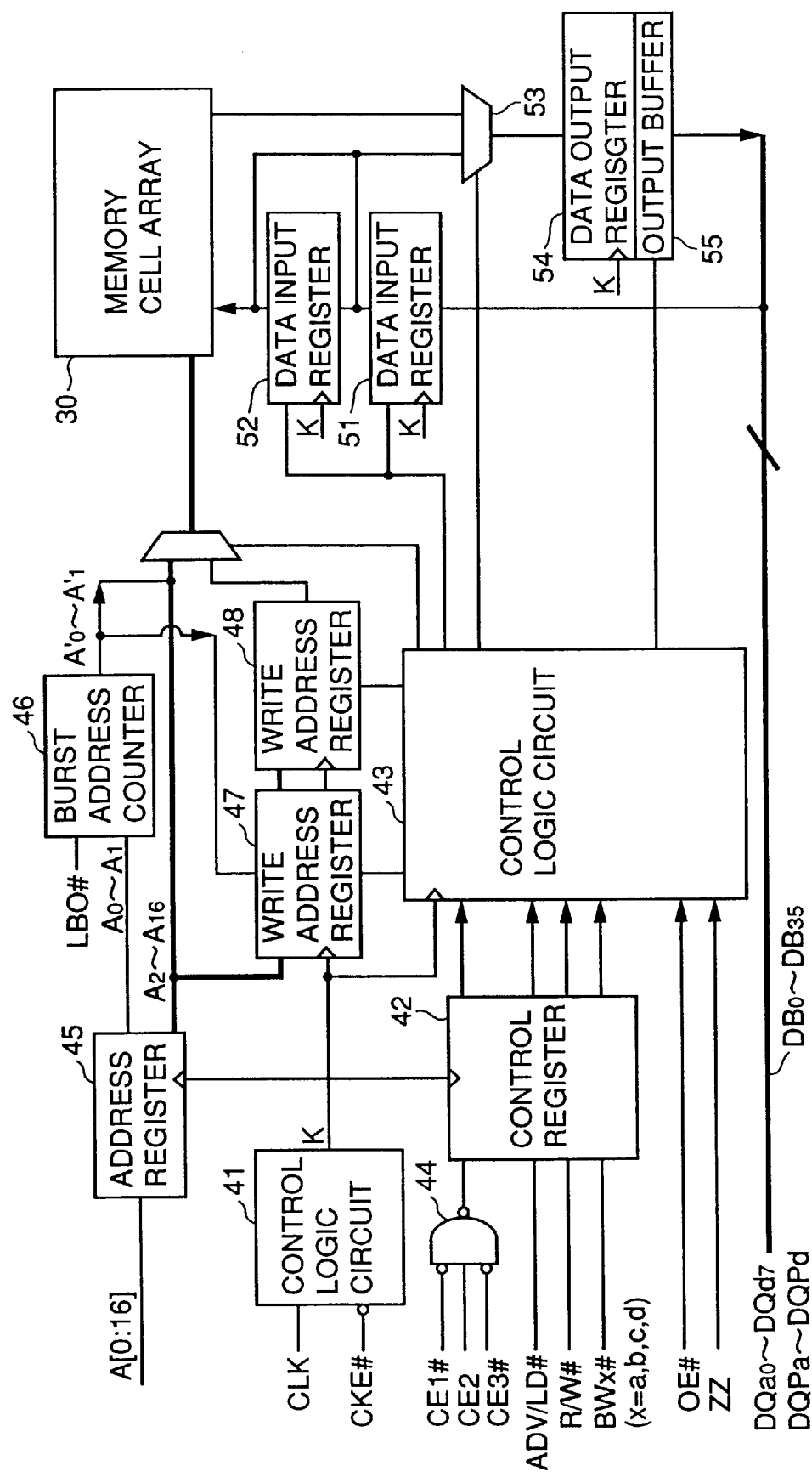
FIG. 15 illustrates an exemplary structure of the synchronous network SRAM.
Figure 16:
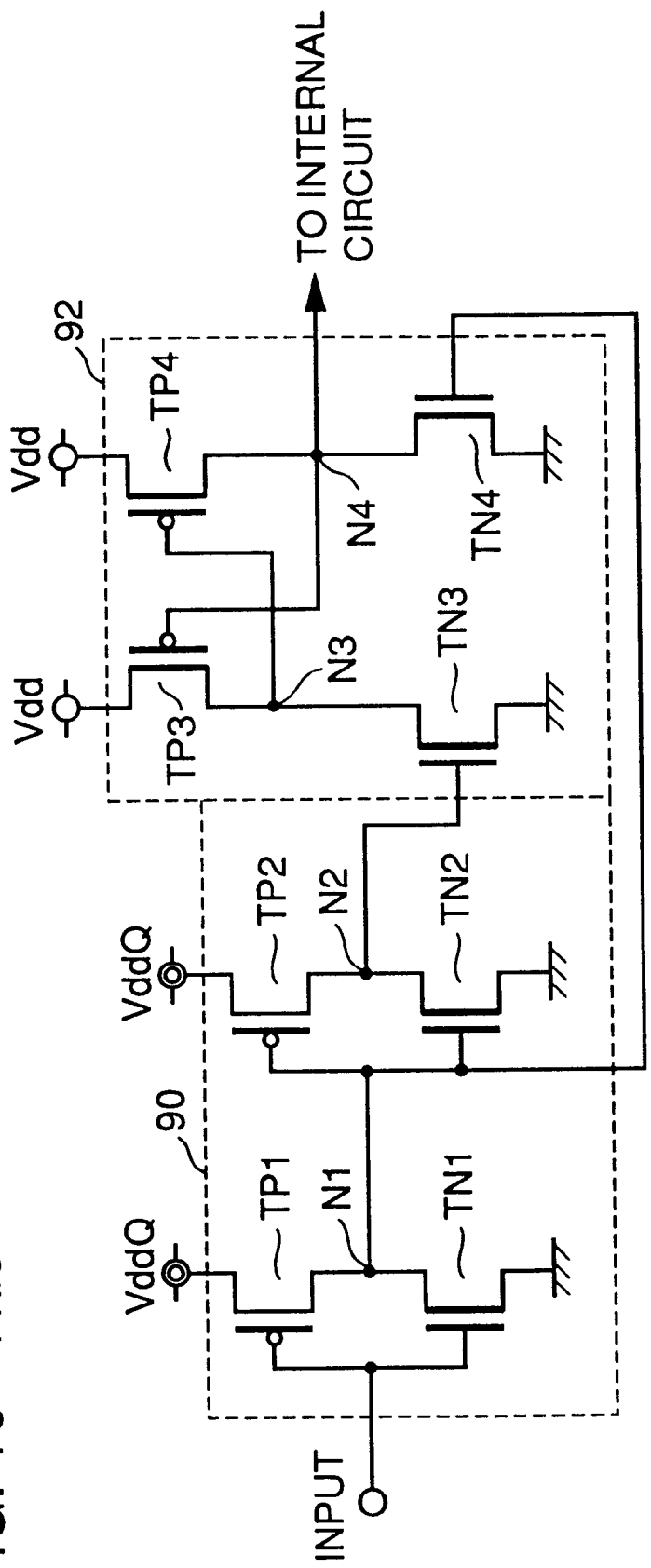
FIG. 16 illustrates an exemplary input buffer 90 in a conventional synchronous SRAM.
Figure 17:
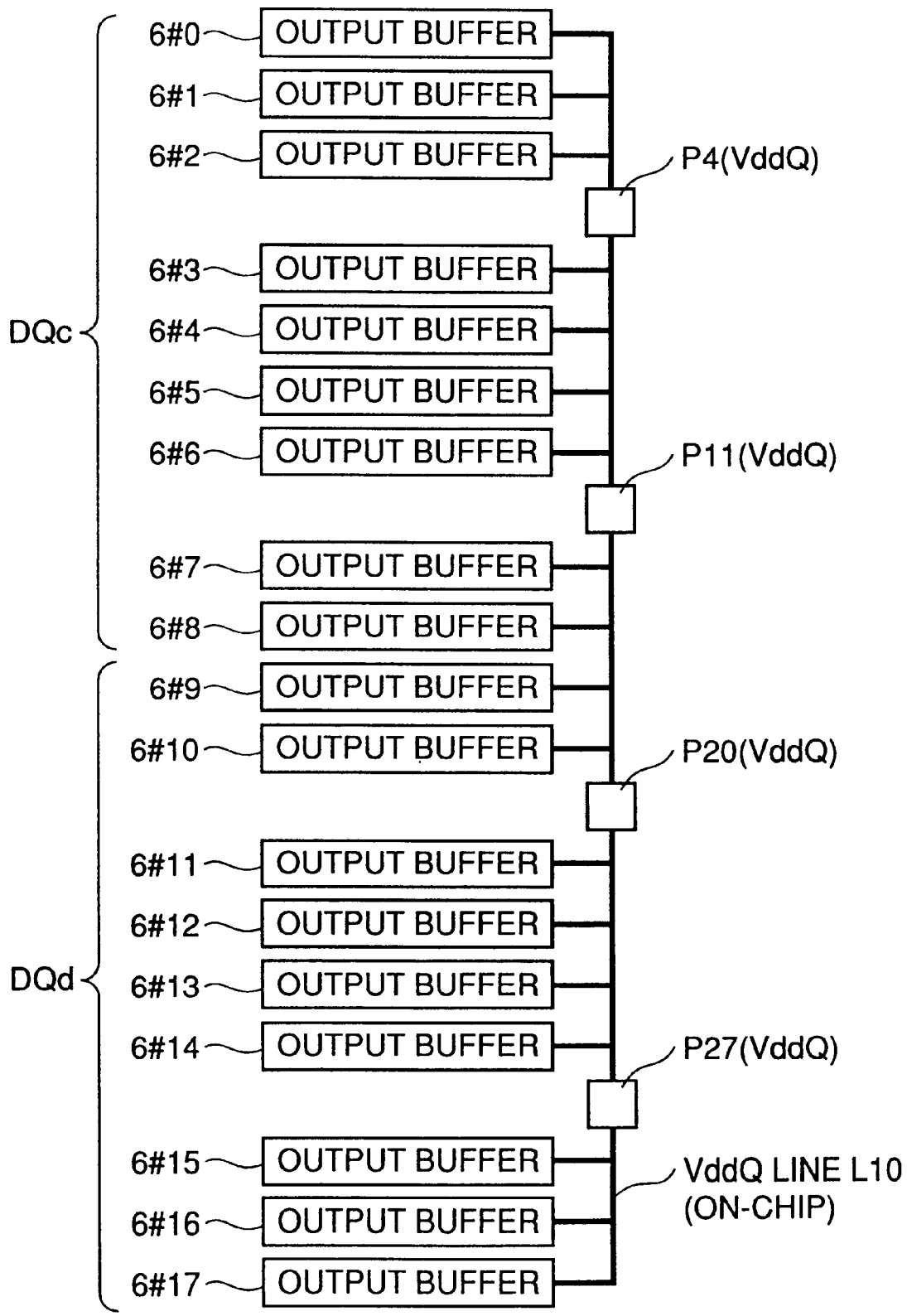
FIG. 17 is a diagram for illustrating power supply paths for output buffers in the conventional synchronous SRAM.
Figure 18:
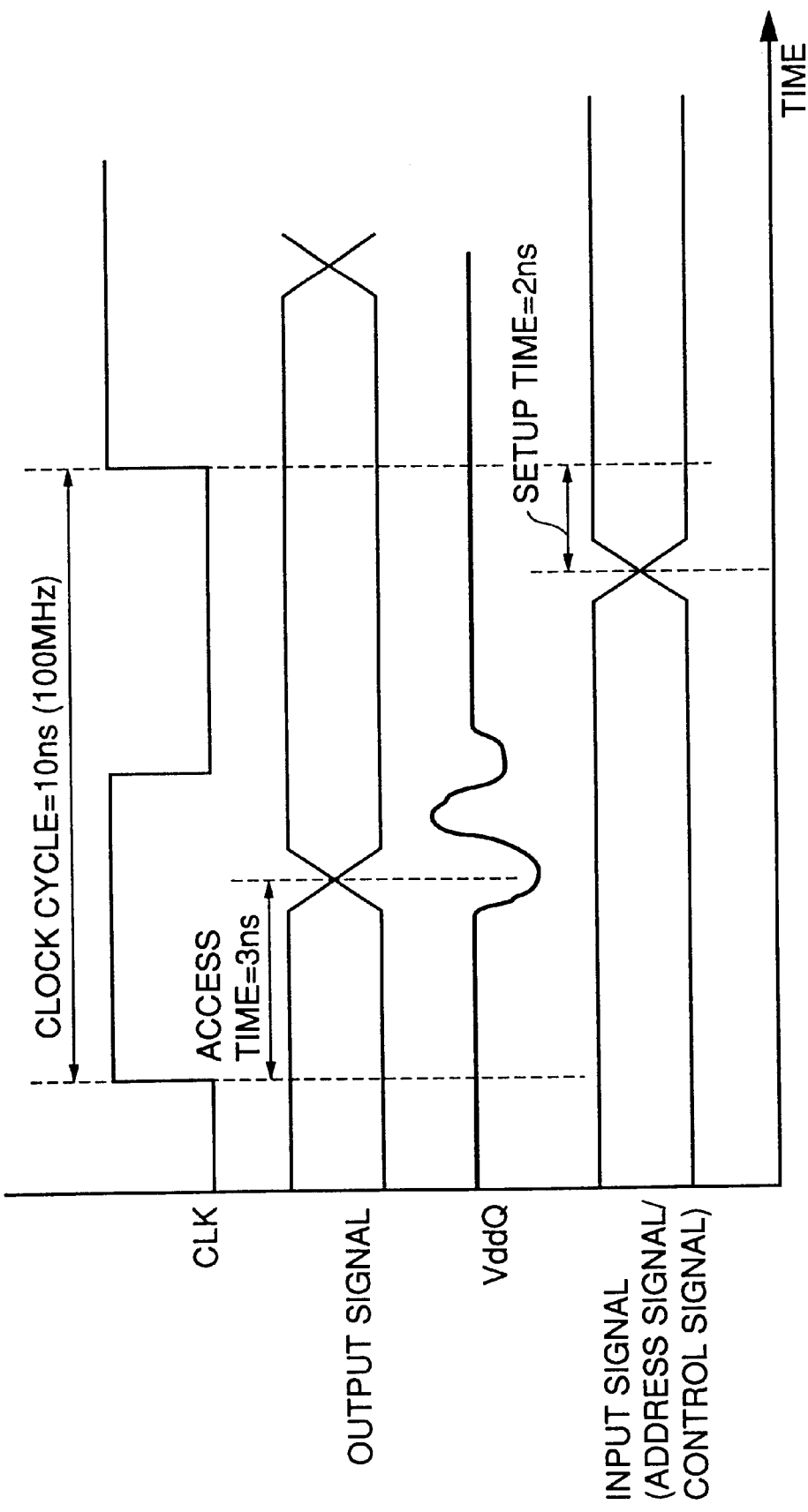
FIG. 18 is a timing chart for illustrating a problem in the conventional synchronous SRAM.
Figure 19:
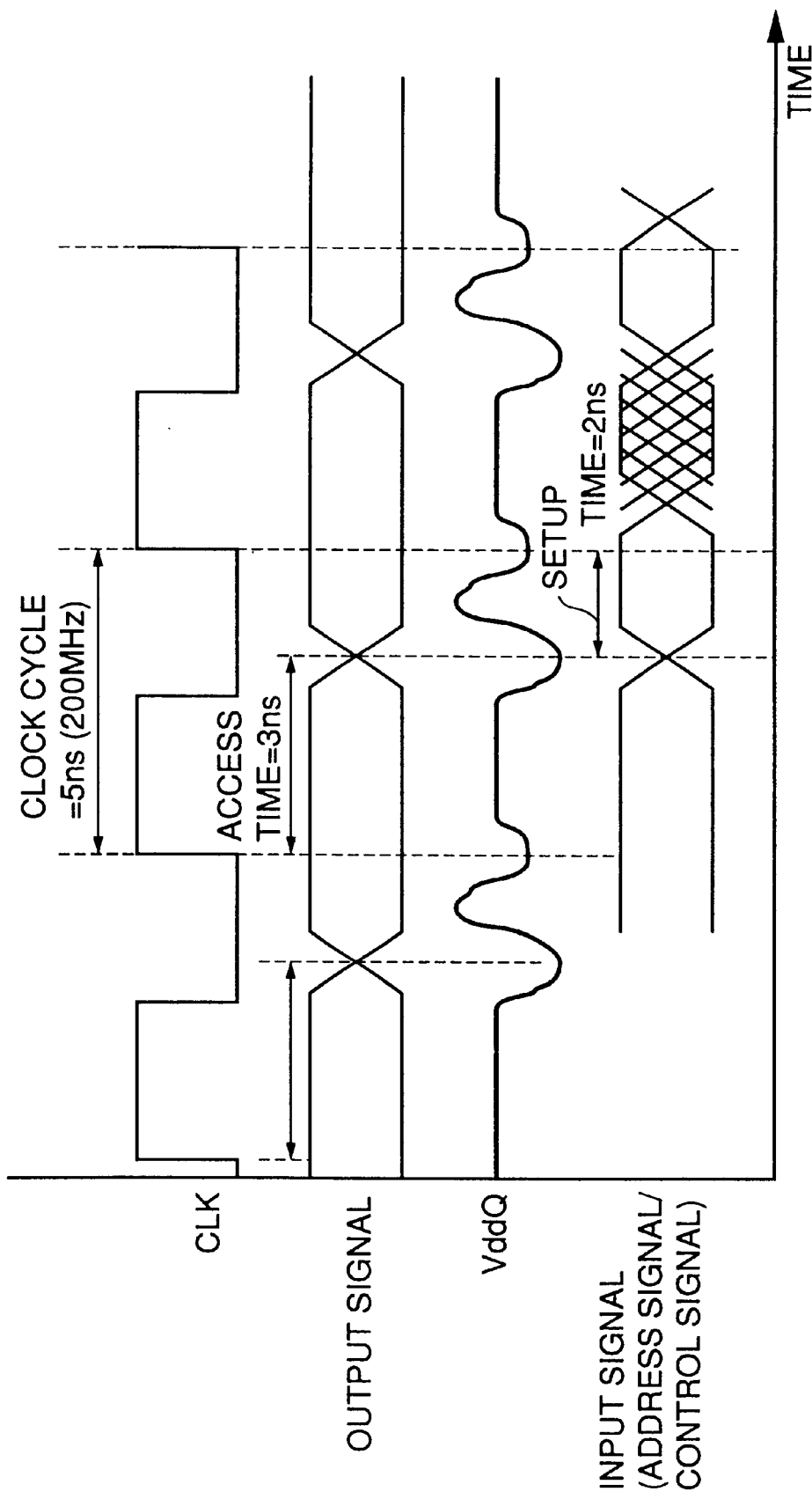
FIG. 19 is a timing chart for illustrating the problem in the conventional synchronous SRAM.
Figure 20:
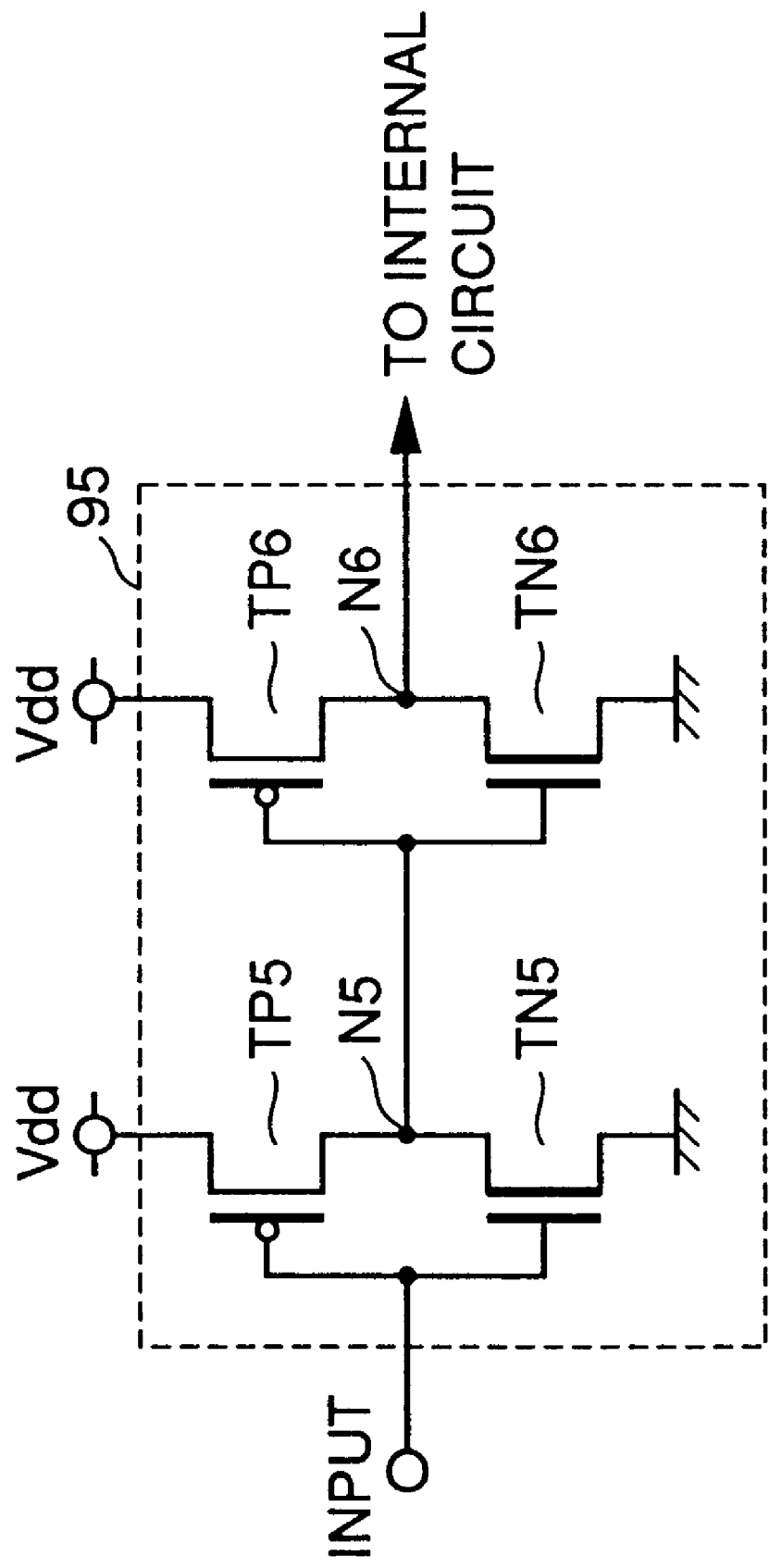
FIG. 20 illustrates another exemplary input buffer 95 in the synchronous SRAM.
Figure 21:
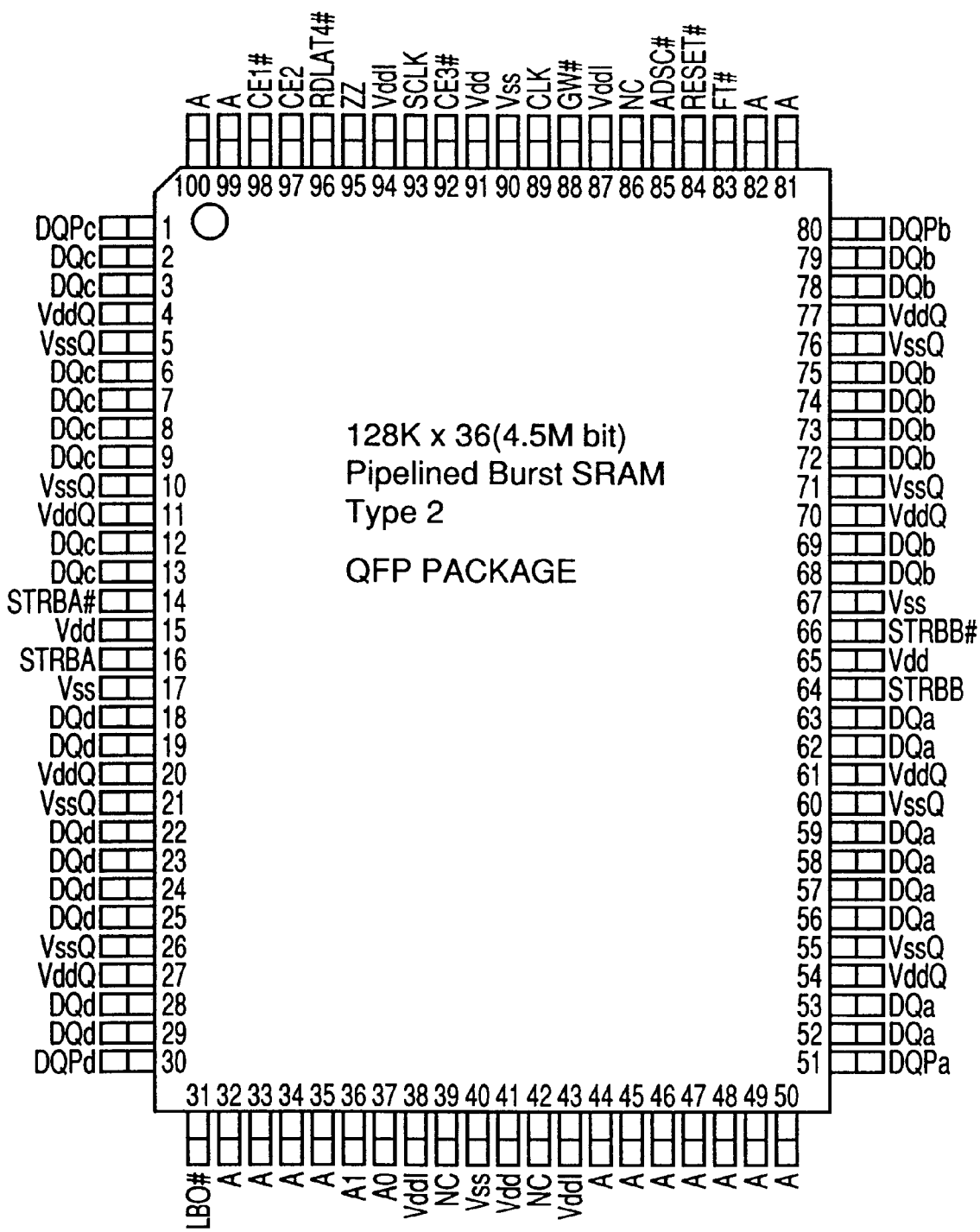
FIG. 21 illustrates exemplary pin arrangement of a type 2 pipelined burst SRAM.

An internal circuit 30 shown in FIG. 11 is a core of the SRAM or a control circuit (e.g., a circuit, included in a control logic circuit 23 or 43, supplied with power VddI) receiving a control signal, for example. The internal circuit 30 operates on the basis of the internal power supply voltage int-Vdd from the power supply node N20 and a ground voltage.

In general, an internal reference potential generation circuit generates the reference potential ref. However, the reference potential ref itself deviates due to dispersion in the process or the like, and the internal power supply voltage int-Vdd deviates from the optimum value. Reliability cannot be ensured if the internal voltage int-Vdd exceeds the optimum value, while the operating speed of the internal circuit 30 is not ensured if the internal power supply voltage int-Vdd falls below the optimum value.

According to the second embodiment of the present invention, therefore, VddQ pins are partially replaced with VddI pins as described with reference to the first embodiment, for employing power VddI with small noise as the reference potential ref.

A stable internal voltage-down circuit can be formed while maintaining compatibility with the conventional synchronous SRAM due to the aforementioned structure, for employing an advanced process having cost effectiveness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   an internal circuit, including a memory cell array, supplied with a first power supply voltage;
   an input circuit capturing a signal for executing a write/read operation of said memory cell array;
   an output circuit outputting data read from said memory cell array; and
   a package, having 100 pins arranged on four side surfaces, enclosing said input circuit, said internal circuit and said output circuit, wherein
   a second power supply voltage is supplied to each of a fourth pin, an eleventh pin, a twentieth pin, a twenty-seventh pin, a fifty-fourth pin, a sixty-first pin, a seventieth pin and a seventy-seventh pin among said 100 pins, and
   said input circuit and said output circuit operate with supply of said second power supply voltage from different pins among said fourth pin, said eleventh pin, said twentieth pin, said twenty-seventh pin, said fifty-fourth pin, said sixty-first pin, said seventieth pin and said seventy-seventh pin.

2. The semiconductor integrated circuit according to claim 1, wherein said package is a quad flat package.

3. The semiconductor integrated circuit according to claim 2, wherein 30 pins in total among said 100 pins, including said fourth pin, said eleventh pin, said twentieth pin and said twenty-seventh pin, are arranged on a first side surface of said package and 30 pins in total including said fifty-fourth pin, said sixty-first pin, said seventieth pin and said seventy-seventy pin are arranged on a second side surface opposite to said first side surface.

4. The semiconductor integrated circuit according to claim 3, wherein at least any of said eleventh pin, said twentieth pin, said sixty-first pin and said seventieth pin is electrically connected with said input circuit.

5. The semiconductor integrated circuit according to claim 3, wherein any of said fourth pin, said twenty-seventh pin, said fifty-fourth pin and said seventy-seventh pin is electrically connected with said input circuit.

6. The semiconductor integrated circuit according to claim 1, wherein said second power supply voltage is equal to a high potential level of each of the input in said input circuit and the output from said output circuit.

7. The semiconductor integrated circuit according to claim 1, further comprising:

a first line for connecting a pin for supplying said second power supply voltage to said input circuit with said input circuit, and a second line for connecting a pin for supplying said second power supply voltage to said output circuit with said output circuit, wherein said first line and said second line are arranged in electrical isolation from each other.

8. The semiconductor integrated circuit according to claim 1, further comprising:

a supply node for supplying an internal power supply voltage to said internal circuit, and a voltage-down circuit stepping down said first power supply voltage in response to the potential difference between a node receiving a reference voltage and said supply node, wherein said node receiving said reference voltage is connected with a pin supplying said second power supply voltage to said input circuit.

9. The semiconductor integrated circuit according to claim 8, wherein said voltage-down circuit includes:

an operational amplifier detecting the difference between said reference voltage and said internal power supply voltage, and a transistor electrically connecting a node receiving said first power supply voltage and said supply node with each other in response to an output of said operational amplifier.

* * * * *